United States Patent [19]

Sugiura et al.

[11] Patent Number: 5,186,750
[45] Date of Patent: Feb. 16, 1993

[54] METHOD AND APPARATUS FOR FORMING SEMICONDUCTOR THIN FILMS

[75] Inventors: Hideo Sugiura; Takeshi Yamada, both of Atsugi; Ryuzo Iga, Yokohama, all of Japan

[73] Assignee: Nippon Telegraph and Telephone Corporation, Tokyo, Japan

[21] Appl. No.: 477,870

[22] PCT Filed: Aug. 15, 1989

[86] PCT No.: PCT/JP89/00827
§ 371 Date: Apr. 10, 1990
§ 102(e) Date: Apr. 10, 1990

[87] PCT Pub. No.: WO90/01794
PCT Pub. Date: Feb. 22, 1990

[30] Foreign Application Priority Data

Aug. 15, 1988 [JP] Japan .................... 63-203,036
Dec. 16, 1988 [JP] Japan .................... 63-318,983
Dec. 16, 1988 [JP] Japan .................... 63-318,986
Jun. 19, 1989 [JP] Japan .................... 64-157,893
Jul. 17, 1989 [JP] Japan .................... 64-185,188

[51] Int. Cl.⁵ .................... C23C 16/00; H01L 21/203
[52] U.S. Cl. .................... 118/50.1; 118/726; 437/173; 437/936
[58] Field of Search .................... 437/107, 173, 936; 148/DIG. 48; 118/50.1, 726

[56] References Cited

U.S. PATENT DOCUMENTS

| | | | |
|---|---|---|---|
| 4,843,031 | 3/1988 | Ban et al. | 437/173 |
| 4,856,458 | 8/1989 | Yamazaki et al. | 118/620 |
| 4,885,260 | 12/1989 | Ban et al. | 437/173 |
| 4,911,101 | 3/1990 | Ballingall, III et al. | 118/725 |
| 5,032,435 | 6/1991 | Biefeld et al. | 118/50.1 |

FOREIGN PATENT DOCUMENTS 57-173933 10/1982 Japan .
58-119630 7/1983 Japan .
60-29680 7/1985 Japan .
62-120016 6/1987 Japan .

OTHER PUBLICATIONS

W. T. Tsang "Chemical beam epitaxy of InP and GaAs" Applied Physics Letters 45, (11), Dec. 1, 1984 p. 1234–1236.
H. Sugiura, et al. "An ion laser-assisted metal organic molecular beam epitaxy of GaAs", Applied Physics Letters 54 (4), Jan 23, 1989 pp. 335–337.
K. Takahashi "Future epitaxial growth process: Photo-MOMBE" Inst. Phys. Conf. Ser. No. 79 Chapter 2 (1985) pp. 73–78.
Appl. Phys. Lett. 47 (2), Jul. 15, 1985 "Laser Enhanced Metalorganic Chemical Vapor Deposition Crystal Growth", Aoyagi et al.
Applied Physics Letters, vol. 52, No. 13, Mar. 28, 1988, pp. 1065–1067, American Institute of Physics, New (List continued on next page.)

Primary Examiner—Brian E. Hearn
Assistant Examiner—Linda J. Fleck
Attorney, Agent, or Firm—Kenyon & Kenyon

[57] ABSTRACT

The growth rate of a compound semiconductor thin film is freely enhanced or suppressed by establishing a proper temperature of a substrate 10, and by irradiating by an MOMBE technique, portions corresponding to a desired pattern on the substrate 10 with laser rays having an energy lower than that of photon which can directly decompose an organometal during film growth. A compound semiconductor thin film having a fine pattern with complicated unevenness can be formed on the substrate 10. The relative positions of the source 11 of laser rays, the optical systems 12 and 31 for irradiating the substrate with the laser rays, and the substrate 10 in the vacuum chamber 1 are maintained constant by mounting the body 1 of the MOMBE system, the source 11 of the laser rays, and the optical system 12 and 31 for guiding the laser rays to the body 1 of the MOMBE system on a vibration proof base 30, whereby the formation of a fine pattern becomes possible.

5 Claims, 16 Drawing Sheets

OTHER PUBLICATIONS

York, N.Y., U.S.; V. M. Donnelly et al.: "Laser-assisted metalorganic beam epitaxy of GaAs".

Patent Abstracts of Japan, vol. 8, No. 206 (E-267)[1643], Sep. 20, 1984; & JP-A-59 92 522 (Nippon Denki K.K.) May 28, 1984.

Applied Physics Letters, vol. No. 14, Oct. 6, 1986, pp. 880-882, American Institute of Physics, New York, N.Y. U.S.; N. H. Karem et al.: "Laser direct writing of single-crystal III-V compounds on GaAs".

Journal of Vacuum Science & Technology/Section B, vol. No. 5, Sep./Oct. 1987, pp. 1460-1464, American Vacuum Society, Woodbury, N.Y. U.S.; Y. Aoyagi et al.: "Atomic-layer growth of GaAs by modulated-continuous-wave laser metal-organic vapor-phase epitaxy".

METHOD AND APPARATUS FOR FORMING SEMICONDUCTOR THIN FILMS

FIELD OF THE INVENTION

The present invention relates to a method for forming, on any portion of a substrate, a thin film of a compound semiconductor having a controlled composition, and a semiconductor thin film forming apparatus for forming a partially thick or only partially grown thin film of a semiconductor by irradiating the substrate with light during growing the thin film of the semiconductor to thus promote the thin film growth reaction.

BACKGROUND OF THE INVENTION

It is a recent tendency to impart greater accuracy and higher function to semiconductor elements. Accordingly, the structure of such semiconductor elements has become more and more precise and complicated. Accordingly, to meet such requirements, a film of a uniform thickness and composition is formed on the surface of a substrate, and then a structure of elements having complicated unevenness on the surface is realized utilizing a highly accurate lithography technique. Recently, for the purpose of simplifying the complicated processing steps for fabricating these elements, it has been tried to control the thickness of a part of a film to be formed on the surface of a substrate during the formation of the film. For instance, in Applied Physics Letters, Vol. 47, 1985, p. 95, there is disclosed a technique which comprises irradiating a substrate with light from an argon laser while forming a GaAs film according to metalorganic chemical vapor desposition method (hereunder referred to as "MOCVD"), to thus form a film only on the portions irradiated with the argon laser rays. The reason why the film is selectively grown on the irradiation portions is that the growth of the film is enhanced by the decomposition of an organometal as a starting material by irradiating it with light. It has been reported that a low pressure mercury lamp, an excimer laser or the like is also effective as a light source other than the argon laser.

As the accuracy and the function of semiconductor elements such as those for optoelectronics become higher, the complexity of the process for fabricating the semiconductor elements has steadily increased.

Recently, there has been developed a metalorganic molecular beam epitaxial growth technique as a novel film growth method. The method is characterized by the use of such a molecular beam.

The molecular beam will now be explained below. The molecular beam refers to the condition that a molecule discharged from a source of the molecular beam reaches a substrate without causing any collisions with molecules remaining in a vacuum chamber. To realize such a condition, the inside of a deposition chamber should be maintained at a high vacuum. In general, the distance between the source of a molecular beam and a substrate ranges from 10 to 20 cm. The mean distance that a molecule proceeds between two consecutive collisions, i.e., the mean free path L can be expressed by the following equation as a function of an internal pressure p of the vacuum chamber: L (cm) = $10^{-2}/p$ (Torr). Therefore, to establish the mean free path L of 10 cm, it is necessary to maintain the inside of the growth chamber at a pressure of not more than $10^{-3}$ Torr.

For the purpose of simplifying processes in fabricating semiconductor devices according to this method, there have been proposed not only structures of such devices but also processes for fabricating semiconductor films. For instance, in Applied Physics Letters, Vol. 52, No. 13, 1988 (Mar. 28), p. 1065, there is disclosed a technique for forming a semiconductor film by partially irradiating a semiconductor substrate placed in a metalorganic molecular beam epitaxial (hereunder referred to as "MOMBE") system with, for instance, excimer laser rays during the fabrication of a semiconductor film to thus selectively form such a semiconductor film on a part of the semiconductor substrate which is irradiated with the laser rays.

However, the excimer laser principally suffers from the following two disadvantages. First, since the wavelength of the laser agrees with that of the light absorbed by an organometal, the organometal is decomposed not only on the substrate but also in the atmosphere. Second, since the excimer laser is a pulse oscillating laser, the energy of the pulse is extremely high. This leads to substantial increase in the temperature of the substrate in proportion to the irradiation of the substrate with the laser. It is difficult to obtain patterns correctly corresponding to the distribution of light, due to these drawbacks. As will be seen from the data listed in Table I, an argon laser is preferable for obtaining such patterns exactly corresponding to the distribution of light.

TABLE I

| | Argon Laser | Excimer Laser |
|---|---|---|
| Form of light | continuous light | pulse light |
| Wavelength | 0.35–0.51 μm | 0.19–0.25 μm |
| Power density (relative ratio) | 1 | $10^5$ |
| Temperature rise of substrate | 20° C. | about 500° C. or more |
| Direct decomposition of organometal | not observed | observed |

In the conventional selective growth by irradiation of light, the MOCVD method for growing a semiconductor film has been exclusively used. This presents a disadvantage that a fine pattern cannot be obtained. The causes of the disadvantage are that (a) in the MOCVD method, the internal pressure of the growth chamber is very high; a film is grown in a hydrogen gas atmosphere having a pressure of several tens to 760 Torr; therefore, a flow of an organometal is induced on a substrate, which results in the formation of a selective film having a smooth shape: and (b) since a growth chamber or a reaction tube is a cylindrical glass tube, it is impossible to project a fine light interference pattern on a substrate; and the possibility of such selective growth also depends on the conductivity type of substrates used; e.g., the selective growth takes place on n-type substrates while a film cannot be selectively grown on a semi-insulating substrate. This presents a substantial restriction when the selective growth is applied to the formation of devices.

Furthermore, in the conventional selective growth by the irradiation of light, the light is irradiated at a low substrate temperature at which the growth of a film is enhanced with the rise of the substrate temperature. This is because a part of an organometal supplied onto the substrate remains undecomposed at a low temperature, and it is used to increase the growth rate of the film through decomposing by the irradiation with light. As has been well known, the quality of a film is deteriorated as the growth temperature decreases. For this reason, films selectively grown according to a conventional method are inferior in their quality, and thus no film has ever been used for fabricating devices.

The MOMBE method makes it possible to eliminate all of the foregoing disadvantages associated with the MOCVD method. The characteristics of these methods are summarized in the following Table II. As will be seen from Table II, the MOMBE method makes it possible to irradiate a substrate with a fine light pattern.

TABLE II

|  | MOCVD | MOMBE |
| --- | --- | --- |
| Apparatus | cylindrical quartz tube | super-high vacuum stainless chamber |
| Pressure during film growth | 10 Torr or more | $10^{-3}$ Torr or less |
| Method for growing films (FIGS. 1, 2) | supplying a starting material with a gas stream and thermally-decomposing it above the substrate | supplying a starting material as molecular beam and thermally-decomposing it on the substrate |
| Material of Group III | organometal | organometal |
| Material of Group V | hydride | thermally-decomposed hydride or metal |
| Incidence of fine light patterns | difficult | easy |

However, when irradiating a substrate within an MOMBE apparatus with light from a laser light source, the MOMBE system and an optical system including a source of laser are separately or independently placed. For this reason, the relative position of the MOMBE system with respect to the optical system varies owing to vibrations in the MOMBE system or caused by other apparatuses, and the aberration of the positions will result. Therefore, the projection of a fine beam or a fine pattern on the substrate is impossible, and further, it is difficult to converge the beam on the substrate sharply with the use of a lens, and contamination of a window is observed during growing a film. These problems will hereunder be discussed in more detail.

Upon selectively growing a fine pattern according to this method for forming a thin film of a semiconductor, it is important to maintain the relative position constant between the growth apparatus and an optical system including lenses and mirrors. To this end, it is conceived, for instance, that the optical system and the growth apparatus are mounted on a vibration proof base.

However, these laser source, optical system and growth apparatus mounted on the vibration proof base are connected to the exterior for the necessity of supplying an electric current, cooling and evacuation. The external vibrations thus exert influence on these laser source, optical system and growth apparatus mounted on the vibration proof base through power supply cords, a cooling water tube, a piping for the vacuum pumping system or the like.

Furthermore, in the conventional apparatus for growing semiconductor films, a substrate-rotating-and-heating portion in the growth system is supported at one side by a supporting bar having only a single bar as a principal component. Thus, the external vibrations transmitted to the vibration proof base easily results in the vibration of the substrate-rotating-and-heating portion, which in turn makes it difficult to maintain the distance constant between the optical system and the substrate within the growth system and to thus selectively grow a fine pattern on the substrate. For instance, in the case where a diffraction grating for a DFB laser is grown through the interference between two laser beams, it is necessary to grow a fine pattern on the order of 0.3 to 0.5 μm, and hence, the amplitude of vibrations of a substrate holder for supporting the substrate and the substrate-rotating-and-heating portion must be sufficiently small compared with the size of the fine pattern. For this reason, the conventional apparatuses cannot grow such a fine pattern.

To obtain a desired pattern of a semiconductor thin film according to the MOMBE method for forming a thin film of a semiconductor, it is of primary importance for a laser beam for irradiating a semiconductor substrate to be controlled and converged to a fine beam. In this respect, it has been known that the diameter of the beam waist (the portion at which the laser rays are converged most finely through a lens) is proportional to the focal length of the lens used. For this reason, it is preferred to use a lens of the shortest possible focal length, and it is also desirable to place the lens as close as possible to the semiconductor substrate. In the conventional MOMBE system, however, the optical system such as a lens is placed outside a window for introducing light into the system and, therefore, it is impossible to sharply converge the laser beam. For instance, when the distance between the substrate and the window ranges from 150 to 600 mm, a lens is placed between the window and the substrate, and the substrate is irradiated with a laser beam having a diameter of about 1.5 mm, the laser beam can only be converged to a diameter of 90 to 400 μm on the surface of the substrate.

Moreover, in the method for forming a thin film of a semiconductor, it is necessary to irradiate a substrate with a laser beam through a window provided on the growth system in order to obtain a desired pattern of a semiconductor thin film. This type of apparatus for growing thin films, such as a molecular beam epitaxial (MBE) system, or an MOMBE apparatus, has a shutter capable of opening and closing the window to prevent the contamination of the window due to the deposition of a semiconductor material by opening the shutter only at a desired time during the film growth, or just before and after the film growth. However, the shutter must be opened for a long period to irradiate the substrate with the laser beam during the film growth. As a result, the window becomes opaque after several cycles of film growth operations, and thus the laser rays cannot be incident upon the substrate. This requires the opening the thin film growth chamber, and the detaching of the window for washing about once a week. Thus, the thin film growth system is often exposed to the air and therefore, the quality of the resulting thin films is insufficient for use in making semiconductor devices.

DISCLOSURE OF THE INVENTION

The present invention is proposed to eliminate the foregoing drawbacks, and accordingly, a primary object of the present invention is to provide a method for forming a thin film of a semiconductor which makes it possible to form a thin film of a semiconductor having fine patterns without using any lithography techniques.

A second object of the present invention is to provide an apparatus for forming a thin film of a semiconductor which makes it possible to easily carry out the aforementioned method according to the present invention.

A third object of the present invention is to provide a semiconductor thin film-forming apparatus for selectively growing a semiconductor thin film while irradiating a semiconductor substrate with light, which makes it possible to project a fine pattern on the substrate by maintaining constant the relative position of the substrate within an MOMBE apparatus to an optical system for irradiating the substrate with light.

A fourth object of the present invention is to provide an apparatus for selectively growing a semiconductor thin film while irradiating a semiconductor substrate with light, which can reduce vibrations of the substrate within an MOMBE apparatus to a minimum level to thus grow a fine pattern of the semiconductor thin film on the substrate.

A fifth object of the present invention is to provide an apparatus for selectively growing a semiconductor thin film while irradiating a semiconductor substrate with light, which permits the elimination of the foregoing drawbacks and the reduction of the relative distance between a substrate placed within an MOMBE apparatus and an optical system for converging light, thus making it possible to form fine patterns of a semiconductor thin film.

A sixth object of the present invention is to provide an apparatus for selectively growing a semiconductor thin film while irradiating a semiconductor substrate with light, which permits the elimination of the foregoing drawbacks and the removal of semiconductor materials adhering to a window provided for introducing laser rays into an MOMBE apparatus keeping at high vacuum, thus making it possible to form semiconductor thin films having good quality.

The method of this invention having the steps of placing a substrate within a vacuum chamber, launching at least one of elements forming a compound semiconductor upon the substrate in the form of an organometal molecular beam, launching the other element forming the compound semiconductor upon the substrate in the form of the molecular beam of the element, and decomposing the organometal on the substrate to thus form a thin film of the compound semiconductor on the substrate, the method comprising the steps of: heating the substrate; launching upon a desired position on the substrate laser rays having a wavelength whose energy is less than that of photon energy required for directly decomposing the organometal incident upon the substrate while heating the substrate; and determining the temperature of the substrate so that a difference in growth rate of the thin film arises depending on the presence or absence of the incident laser beam.

In the foregoing method, the compound semiconductor can be a III-V compound semiconductor, the organometal may be that of a Group III metal, and the other element may be a Group V element.

Examples of Group III elements are Ga or In or both of these.

The organometal starting material of gallium is selected from the group including triethylgallium, trimethylgallium, triisobutylgallium and diethylcyclopentadienylgallium. The organometal starting material of indium can be trimethylindium.

The molecular beam of the group V element can be obtained by thermally decomposing hydride gas in a thermal-decomposition cell placed within the vacuum chamber.

The group V element can be metal arsenic, or arsenic obtained by thermally decomposing arsine, or further it may be phosphorus obtained by thermally decomposing phosphine.

The laser rays can be rays from an argon laser.

The substrate can be heated to a temperature at which the growth of the thin film is enhanced at the portion on the substrate which is irradiated with the laser rays. Alternatively, it can be heated to a temperature at which the growth of the thin film is suppressed at the portion on the substrate which is irradiated with the laser rays.

The laser rays may be coherent light incident upon the substrate from two directions to thus form an interference pattern on the surface of the substrate by means of the coherent light.

The apparatus for selectively forming a thin film of a semiconductor comprises a vacuum chamber constituting a body of a metalorganic molecular beam epitaxial system; a vacuum system for establishing a vacuum within the vacuum chamber by evacuation; a holder for holding a substrate within the vacuum chamber; a first cell for forming a molecular beam of an organometal including an element which is a component of a compound semiconductor and for guiding the formed molecular beam to the substrate; a second cell for forming a molecular beam including an element which is the other component of the compound semiconductor and for guiding the formed molecular beam to the substrate; a first supply system for supplying a starting material for the organometal to the first cell; second supplying system for supplying the second cell with a starting material of the other element; a source of laser rays for generating laser rays with which the substrate is irradiated; an optical system for guiding the laser rays from its source to the substrate; a light lead-in window through which the laser rays from the optical system to the substrate placed within the vacuum chamber; and a vibration proof base on which the source of laser rays, the optical system and the vacuum chamber are mounted so that the propagation of external vibrations can be prevented.

The apparatus can be designed so that the parts of the vacuum system which generate vibrations are placed on a floor different from the vibration proof base, and that the vacuum chamber is communicated with the vibration-generating parts through flexible members to thus prevent the vibration from propagating from the floor to the vibration proof base.

The apparatus can be equipped with a first and a second supporting rod for a substrate holder: the first supporting rod supports the substrate holder in the vacuum chamber so as to adjust the position of the substrate holder; and the second supporting rod is pressed against the substrate holder or the first supporting rod so as to restrict the shift of the substrate holder or the first supporting rod.

The apparatus can be further provided with a second optical system placed inside the light lead-in window of the vacuum chamber, which transmits the laser rays to the substrate, and a means for heating the second optical system.

It can be possible to place, within the vacuum chamber, a jig which is in contact with the internal planar surface of the light lead-in window, and can remove deposits formed on the window surface.

MOST PREFERRED EMBODIMENTS FOR CARRYING OUT THE INVENTION

The method for forming a thin film of a semiconductor according to the present invention will hereunder be described with reference to the following working Examples 1 to 3.

EMBODIMENT 1

Figure 1:
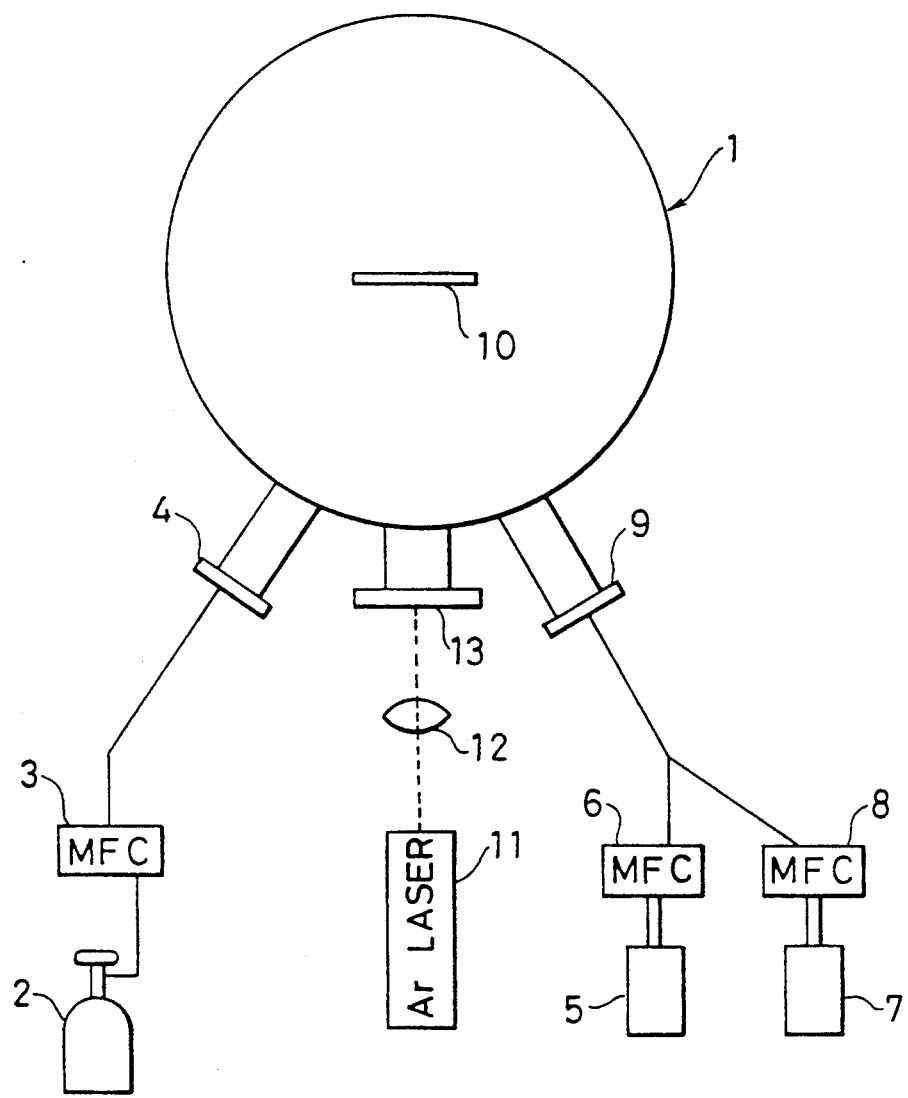
FIG. 1 is a schematic diagram showing an arrangement of the apparatus used in the first embodiment of the method according to the present invention.

FIG. 1 shows an embodiment of the construction of an apparatus used for performing the method of the present invention.

In FIG. 1, the reference numeral 1 designates a vacuum chamber, 2 designates a cylinder for arsine, 3, 6 and 8 mass flow controllers (MFC), 4 a thermal decomposition cell attached to the vacuum chamber 1, 5 and 7 cylinders for organometals, 9 a molecular beam generating cell for organometal attached to the vacuum chamber 1, 10 a substrate placed within the vacuum chamber 1, 11 an argon laser, 12 a lens, and 13 a window attached to the vacuum chamber 1.

Arsine ($AsH_3$) from the arsine cylinder 2 is supplied to the thermal decomposition cell 4 through MFC 3 to generate an arsenic molecular beam by thermally decomposing arsine, and the molecular beam is guided to the vacuum chamber 1. The organometals from the organometal cylinders 5 and 7 are supplied to the organometal molecular beam generating cell 9 through MFC 6 and/or 8 to generate the organometal molecular beam, and the molecular beam thus generated is introduced into the vacuum chamber 1. The laser rays from the argon laser 11 are converged by the lens 12, and irradiate the substrate 10 placed in the vacuum chamber 1 through the window 13. In this Embodiment 1, and InP substrate is used as the substrate 10.

In Embodiment 1, an InGaAs film was grown on the InP substrate 10 while irradiating the substrate with the argon laser. More specifically, the internal pressure of the vacuum chamber 1 was first reduced to a high vacuum on the order of $10^{-10}$ Torr. Arsine of 100% concentration was used as the hydride gas, i.e., the starting material or arsenic. The flow rate of arsine from the cylinder 2 was set at 10 cc/min using MFC 3, and the thermal decomposition cell 4 was heated to 950° C. to generate an arsenic molecular beam. As hydrogen was generated during the thermal decomposition, the degree of vacuum in the vacuum chamber 1 was about $2 \times 10^{-4}$ Torr. As an organometal of a gallium material, triethylgallium (hereunder referred to as "TEG") charged in the cylinder 5 was used. The TEG cylinder 5 was opened, and the flow rate thereof was controlled to 0.47 cc/min utilizing MFC 6. Trimethylindium (TMI) charged in the cylinder 7 was used as an organometal of an indium material. The TMI cylinder 7 was opened, and the flow rate thereof was adjusted to 0.53 cc/min utilizing MFC 8. These organometal gases were mixed and supplied to the molecular beam generating cell 9. Then, the mixed molecular beam of TEG and TMI was guided to the surface of the InP substrate to thus irradiate the substrate with the molecular beam.

Thus, the growth of an InGaAs film was initiated on the InP substrate 10. Several minutes after the initiation of the film growth, a laser beam having an intensity of 500 mW was outputted from the argon laser 11. The laser beam was converged through the lens 12, and the InP substrate 10 was perpendicularly irradiated with the laser beam through the window 13.

At this stage, the lens 12 was adjusted so that the diameter of the laser beam was converged to 400 μm. After one hour, the supply of TEG and TMI was stopped to finish the growth of the InGaAs film, and at the same time the irradiation of the substrate with the laser beam was also stopped. The laser irradiation portion of the film-thus formed has spot-like unevenness depending on the temperature of the substrate.

Figure 2:
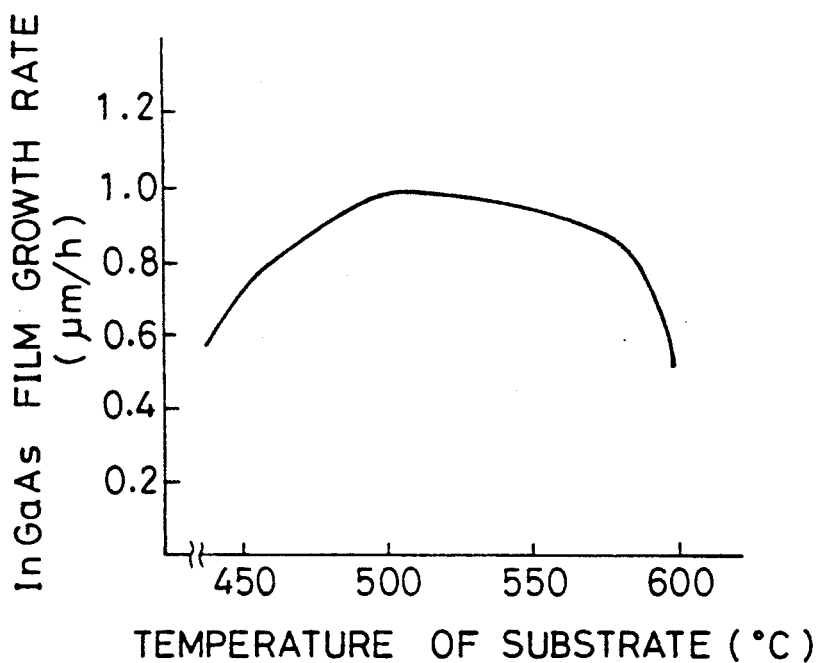
FIG. 2 is a graph illustrating the substrate-temperature dependence of the growth rate of an InGaAs film.

FIG. 2 shows the substrate temperature dependence of the growth rate of the film grown on the portions which were not irradiated with the laser beam in the present example. The growth rate increased with raising substrate temperature in a temperature range of 400° to 500° C. Beyond that, the growth rate decreased with raising substrate temperature.

Figure 3:
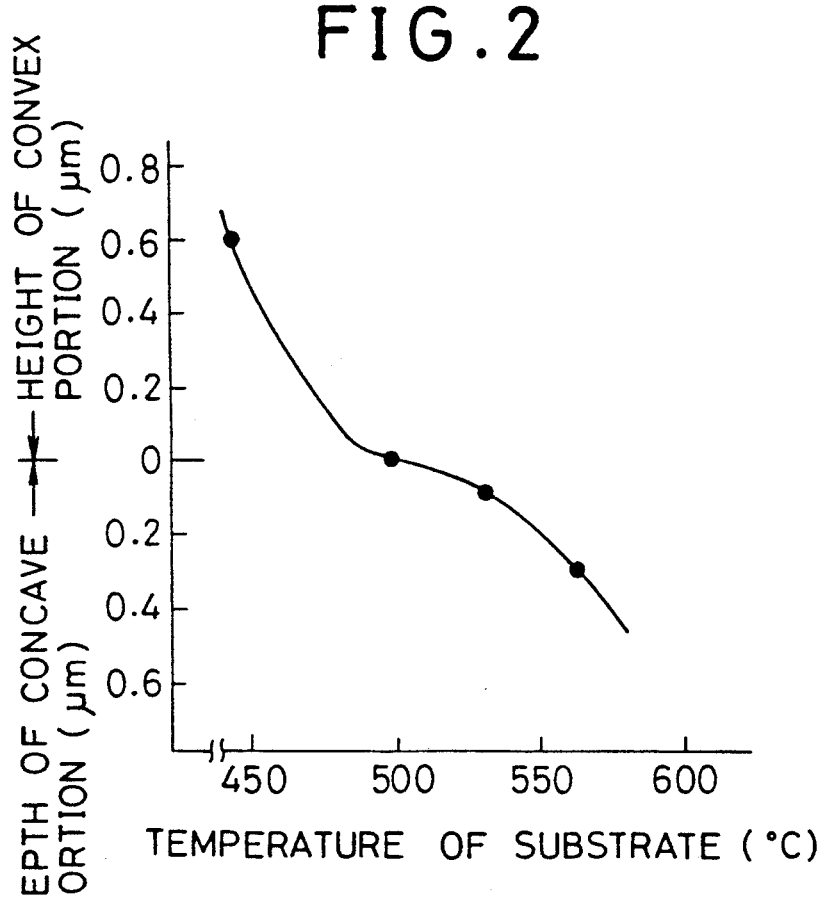
FIG. 3 is a graph illustrating the substrate-temperature dependence of the height of uneven portions of a film formed.

FIG. 3 shows the relationship between the temperature of the substrate during the film growth and the height of the convex portions or the depth of the concave portions in the present example. When the temperature of the substrate was lower than 500° C., convex spots were formed on the portions irradiated with the laser beam, and the height of the convex portions increased as the substrate temperature decreased. In this respect, when the optical properties of the convex portions were examined by a cathode luminescence, the intensity of the luminescence reduced as the substrate temperature decreased; in other words, it was found that the film quality deteriorated.

On the other hand, when the substrate temperature was higher than 500° C., the portions irradiated with the laser beam had concave shape due to growth rate suppression by the laser-irradiation. The depth of the concave portions increased as the substrate temperature increased. The concave portions had a mirror surface the reflectance of which is almost equal to that of the non-laser-irradiation portions. However, if the substrate temperature was 600° C., the entire surface was thermally etched and got cloudy irrespective of laser-irradiation or non-irradiation portions. The concave portions of the film grown at a temperature ranging from 500° to 560° C. was analyzed by Auger electron spectroscopy, it was found that the content of gallium had reduced. In addition, when the substrate temperature was maintained at 530° C., the depth of the concave portions increased with the increasing intensity of the laser beam.

In general, light is expressed by the wavelength (expressed in terms of μm) thereof or its photon energy (expressed in terms of electron volt "eV"). They can be converted by the following equation:

Photon Energy (eV) = 1.24/wavelength (μm).

Figure 4:
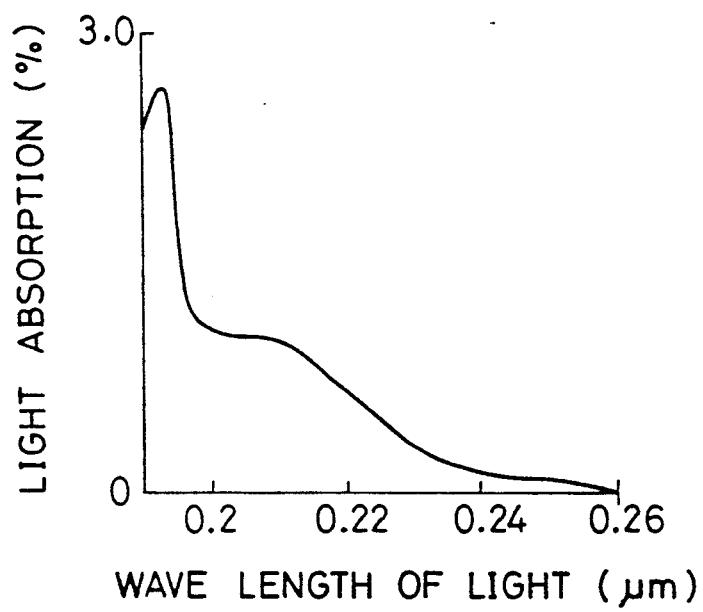
FIG. 4 is a graph illustrating light absorbing characteristics of triethylgallium.

Organometals can be decomposed by the aforementioned thermal decomposition or photodecomposition. The photodecomposition will now be explained in more detail below. For instance, triethylgallium (TEG) whose light-absorbing characteristics are shown in FIG. 4 has the light absorbing peak at around 0.2 μm (corresponding to about 6 eV in terms of photon energy), and the amount of light-absorption thereof decreases with the increasing wavelength of light (i.e., with the reducing photon energy thereof). Most organometal molecules including TEG absorb light of a wavelength of about 0.2 μm. Therefore, when light having a photon energy of not less than 6 eV, for instance, light from an excimer laser (wavelength=0.19 to 0.25 μm) is irradiated, the organometal molecules are photodecomposed before they reach the surface of the substrate even in the gas phase at the room temperature. This phenomenon is called "direct decomposition" in the present invention. If the light having a photon energy of not less than 6 eV is employed, the organometal molecules decomposed in the gas phase reach the surface of the substrate. Therefore, an intended pattern of a selective growth cannot be obtained, and the resolution becomes low, and hence, it is impossible to form the pattern having complicated concave portions on desired positions.

In the present invention, the molecular beam of an organometal is decomposed only on the surface of the substrate. To this end, it is necessary to use light having the photon energy of not more than 6 eV to thus prevent the occurrence of such direct decomposition.

The reasons why an Ar laser is used in the present invention are: (1) the Ar laser emits three kinds of laser light the wavelengths of which are 0.355, 0.488 and 0.514 μm, respectively, each corresponding to light having the photon energy of not more than 6 eV and thus, a fine pattern can be formed since the Ar laser rays decompose only the organometal molecules that reach the surface of the substrate; and (2) the output power (25 W) thereof is greater than that of other lasers commercially available at the present time. Tests were carried out using light of 0.51 μm.

The control mechanism of the growth rate in the present invention will be explained below in more detail.

In the MOMBE system, the film growth rate is determined by the decomposition efficiency of the organometal molecules.

First, the mechanism of increase in the growth rate will be described.

The decomposition efficiency of the organometal molecules exponentially increases with the increase in the temperature of the substrate. If the substrate is irradiated with light at a low temperature at which the organometal molecules are not sufficiently decomposed, the undecomposed organometal molecules are decomposed, and hence, the growth rate increases. Such enhancement of the growth rate has been confirmed in both MOCVD and MOMBE systems.

Such enhancement of the growth rate has been confirmed only with regard to the films of GaAs. However, the inventors of the present invention confirm such enhancement with regard to the films of InP, GaP, GaAsP, InGaAs, InGaP and InGaAsP in addition to the films of GaAs.

Then, the mechanism for suppressing the growth rate will be described.

The inventors of this invention have confirmed with regard to the molecular beams containing both the In and Ga materials that the growth rate decreases in the MOMBE system when the temperature of the substrate increases beyond the range within which the organometal molecules are completely decomposed. This is because the organometal molecules which absorb the Ar laser lays weaken their absorbability to the substrate, and hence, molecules are evaporated from the surface of the substrate prior to the complete decomposition thereof. In contrast, when the molecular beam contains only the Ga material, not the suppression but the enhancement of the growth rate was observed. When the substrate is irradiated with laser rays in such a high temperature region, the evaporation of the organometal molecules in enhanced and the portions irradiated with the laser become concave. In other words, the growth rate is suppressed.

In particular, in the case of an InGaAs film which contains both the In and Ga, it was confirmed that the growth rate increased at temperatures lower than 500° C., while it was suppressed at temperatures higher than 500° C., as will be seen in FIG. 3. It is herein confirmed, from the results of compositional analysis, that the amount of In remains unchanged while that of Ga varies by the irradiation of laser rays.

Moreover, an InGaAs film grown at a temperature higher than 500° C. exhibits excellent electrical properties; its mobility being 37,500 cm$^2$/Vs. It is found that no difference between the luminescence intensities on the laser-irradiation and non-irradiation portions is observed, and that each half-width of the luminescence intensities of these portions is less than 10 meV, which is very excellent.

As has been explained above, according to the present embodiment of this invention, a thin film of a semiconductor, which has fine patterns including complicated concave portions at desired positions on the substrate, can be obtained without using a photolithography technique. Although optoelectronic integrated circuits (hereunder referred to as "OEIC") have been expected as future key devices, it is necessary to repeat a film growth process several times to fabricate such devices. The conventional technique, however, results in a variety of defects at the boundary between two adjacent layers of semiconductors formed by consecutive two film-forming processes. This is a major cause of the degradation in the device quality. If the method of this embodiment is applied to fabricate such an OEIC, the number of processes can be substantially reduced and the occurrence of defects at the boundary can be prevented. Therefore, the method greatly serves to improve the quality of elements and to provide high reliability.

Although an embodiment of fabricating an InGaAs film having a desired pattern has been described in the foregoing Embodiment 1, the suppression of InGaP and InGaAsP by the Ar laser is also confirmed. Such effect can be widely applied to the fabrication of DFB lasers for improving such functions as arraying, multi-wave length oscillation, and long wavelength sweep.

EMBODIMENT 2

In this example, an experiment in which a spotlike GaAs film is selectively grown using an Ar laser will be described. In this Embodiment, a GaAs wafer was used as the substrate 10. The cylinder 7 for organometal was not used, and the cylinder 5 was charged with TEG.

First, the internal pressure of the vacuum chamber 1 was reduced to a high vacuum on the order of 10$^{-10}$ Torr. Arsine of 100% concentration was used as the hydride gas, i.e., the starting material of arsenic. The flow rate of the arsine gas from the cylinder 2 was set at 6 cc/min using MFC 3, and the arsenic molecular beam was generated in the thermal decomposition cell 4 heated to 950° C. The degree of vacuum of the vacuum chamber was decreased to about 10$^{-4}$ Torr due to the hydrogen gas generated during the thermal decomposition. The GaAs substrate 10 was heated to 600° C. while irradiating it with the arsenic molecular beam to make the surface of the substrate clean, and the temperature of the substrate was reduced to 425° C. while irradiating it with the arsenic molecular beam. Triethylgallium (hereunder referred to as "TEG") was used as the starting material organometal for gallium. The TEG cylinder 5 was opened, the flow rate thereof was adjusted to 1 cc/min with MFC 6, and the TEG molecular beam from the cell 9 for generating the organometal molecular beam was directed to the substrate 10 to thus irradiate it with the molecular beam of TEG.

Thus, the growth of the film of GaAs was initiated. Several minutes after the initiation of the growth, a laser beam having an intensity of 500 mW was outputted from the Ar laser 11. The laser beam was converged through the lens 12, and perpendicularly irradiated the substrate 10 through the window 13. The laser beam was adjusted so that the diameter thereof was converged to 400 μm. After one hour, the supply of TEG was stopped to finish the growth of a GaAs film. At the same time, the irradiation with the laser beam was also stopped. Spot-like projections were observed on the portions irradiated with the laser beam on the film thus formed.

Figure 5:
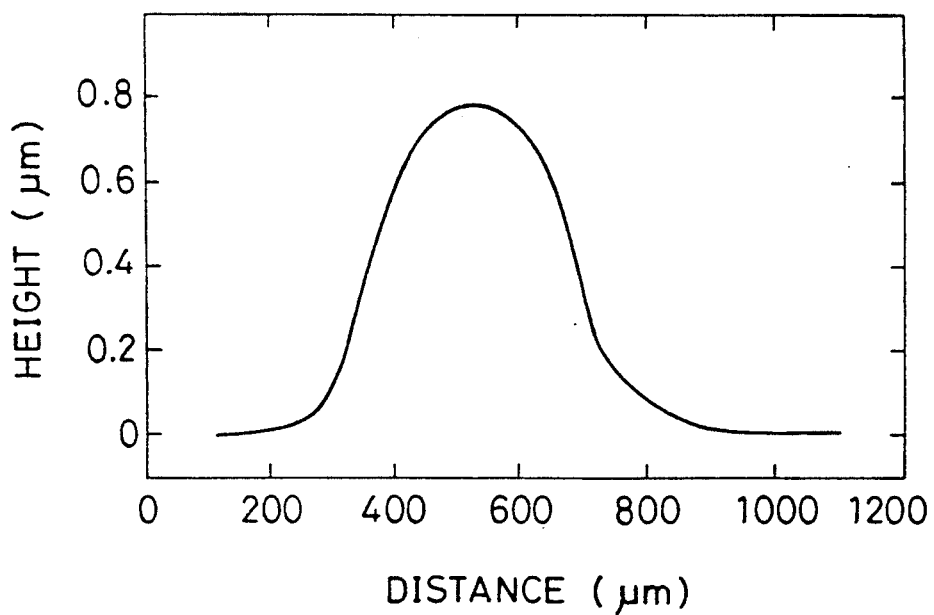
FIG. 5 is a graph illustrating the profile of the section of a spot.

FIG. 5 shows the profile of such a spot. It is found that the profile shows a Gaussian distribution with a diameter of 400 μm, which reflects the intensity distribution of the laser rays.

The height of the spot increases in direct proportion to the intensity of the laser rays. This means that the increase in the growth rate of the GaAs film grown according to the method of this embodiment is due to a photodecomposition reaction. In this respect, such an increase in the growth rate by the irradiation with the Ar laser rays is also observed in the case where TEG is used as the starting material for gallium, and metal arsenic is employed in place of arsine as the starting material for arsenic.

Figure 6:
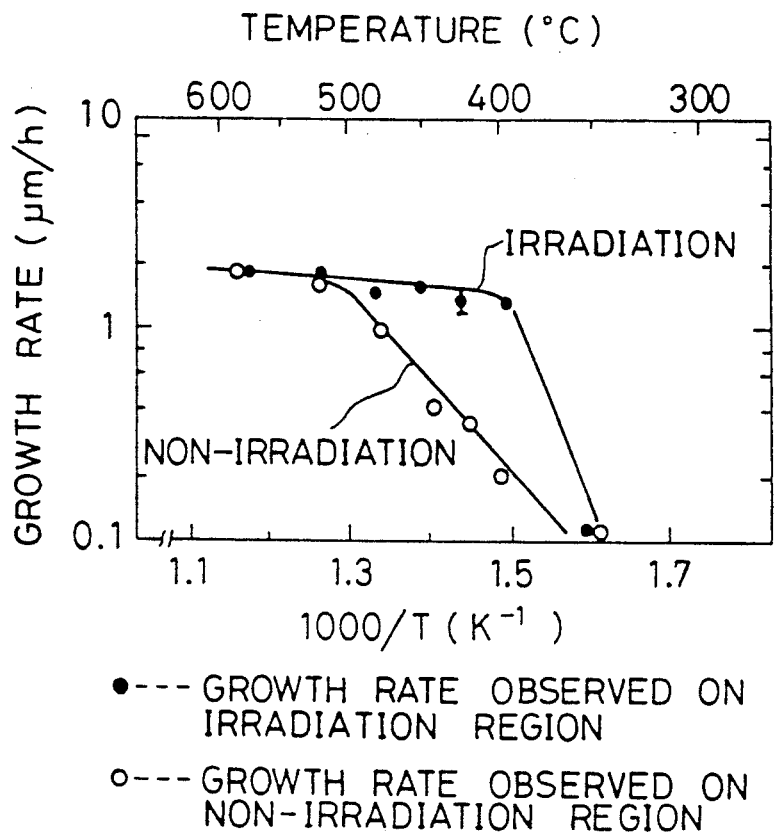
FIG. 6 is a graph illustrating the relationship between the temperature of the substrate and the growth rate observed on the irradiation portions with laser rays and non-irradiation portions.
Figure 7:
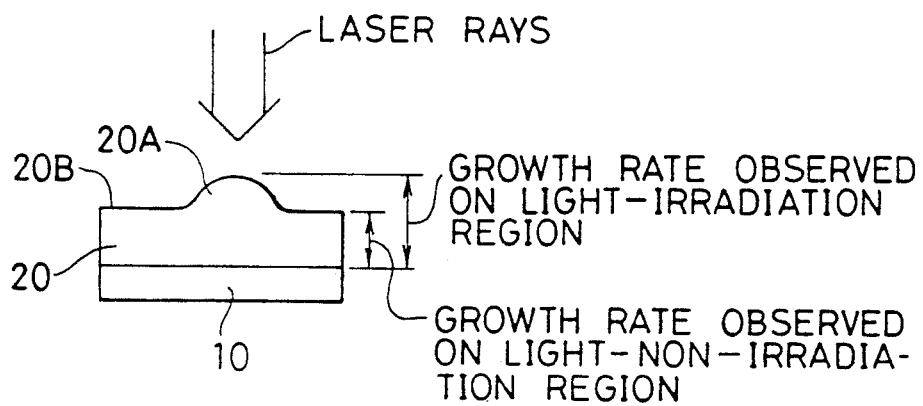
FIG. 7 is a diagram for explaining the growth of a thin film on a substrate.

FIG. 6 shows the substrate temperature dependence of the growth rate on the laser-ray-irradiation and non-irradiation portions. FIG. 7 shows a projection 20A of a thin film 20 formed on the substrate 10 due to the difference in the growth rate. The projection 20A is formed on the portion which is irradiated with light, and the other portion 20B corresponds to those which are not irradiated with light. It is found in FIG. 7 that the growth rate of the light-irradiation region 20A is greater than that of the non-irradiation region 20B, and that the projection 20A reflects a selective growth rate. As seen from the results shown in FIG. 6, a substrate temperature ranging from 400° to 550° C. is preferable to achieve the optimum effect of the laser irradiation. The completely identical temperature dependence was observed with regard to n-type, p-type, and semi-insulating substrates.

The content of carbon present in the film formed was determined; it was found that the content of carbon in the laser-ray-irradiation portion was not more than 1/100 of that in the non-irradiation portion.

Figure 8:
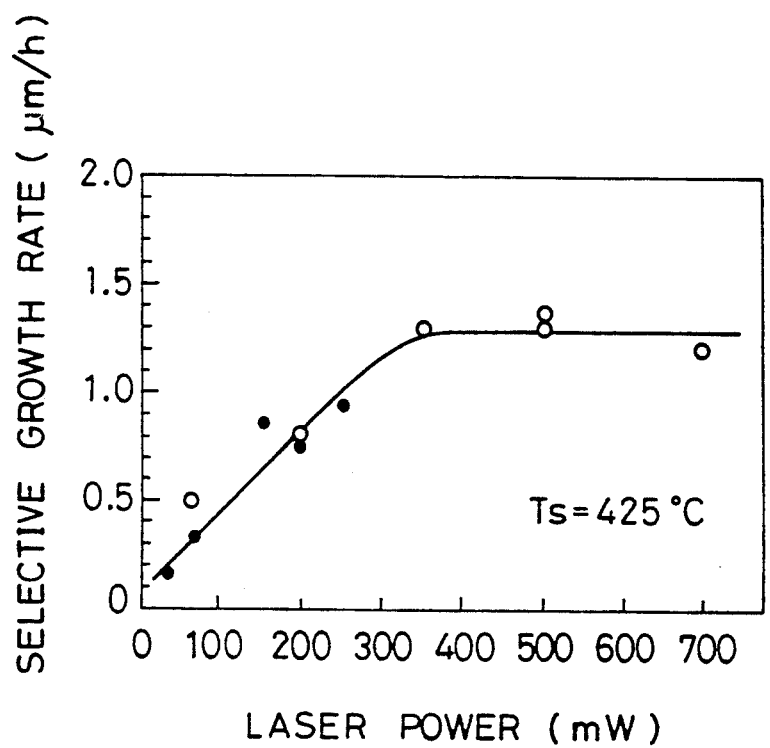
FIG. 8 is a graph illustrating the relationship between the laser power and the selective growth rate.

FIG. 8 shows the relationship between the laser power and the selective growth rate. In this case, the diameter of the laser beam was 400 μm.

EMBODIMENT 3

Figure 9:
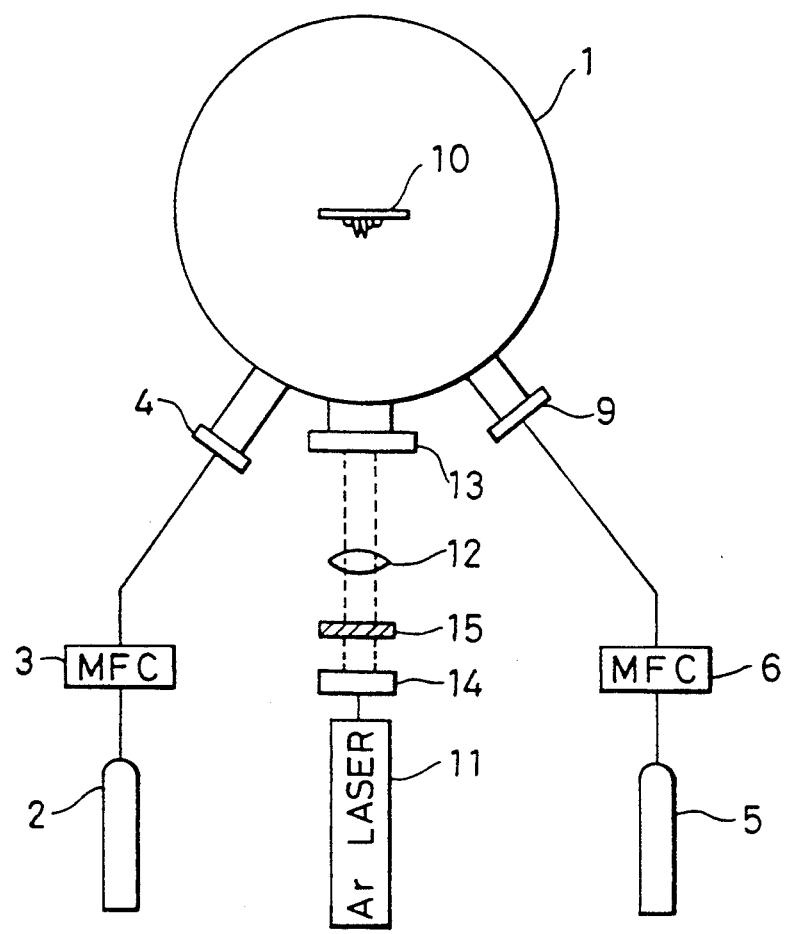
FIG. 9 is a schematic diagram showing a configuration of the apparatus used for carrying out Embodiment 3 according to the present invention.

An embodiment in which a GaAs film having a stripe pattern is formed according to the method of the present invention will now be described below. FIG. 9 shows the construction of an apparatus used in this example.

In FIG. 9, a vacuum chamber 1, a cylinder 2 for arsine, a mass flow controller 3, a thermal decomposition cell 4, a cylinder 5 for organometals, a mass flow controller 6, a cell 9 for generating an organometal molecular beam, a GaAs substrate 10, an argon laser 11, a lens 12, and a window 13 are similar to those shown in FIG. 1. The apparatus used herein is further provided with a beam expander 14 and a mask 15 placed between the laser 11 and the lens 12.

According to the same procedures as in Embodiment 1, a GaAs substrate 10 was provided, and a film of GaAs was formed on the substrate 10 while irradiating the substrate with the molecular beam of TEG. In this case, the laser beam was once expanded to a diameter of 5 mm using the beam expander 14, and then was diffracted by transmitting the beam through the mask 15 which is a glass plate on which a metal had been coated in a stripe pattern having a pitch of 1 mm. The diffracted pattern of the laser beam was further converged on the surface of the substrate 10 by means of lens 12.

Figure 10A:
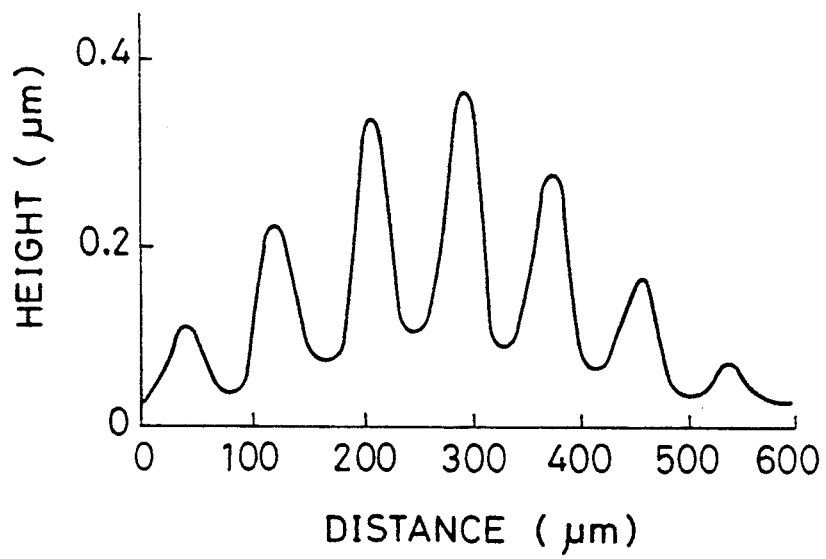
FIGS. 10A and 10B are graphs illustrating the profile of the section of a film, and the intensity distribution of light at the portion irradiated with laser rays, respectively.
Figure 10B:
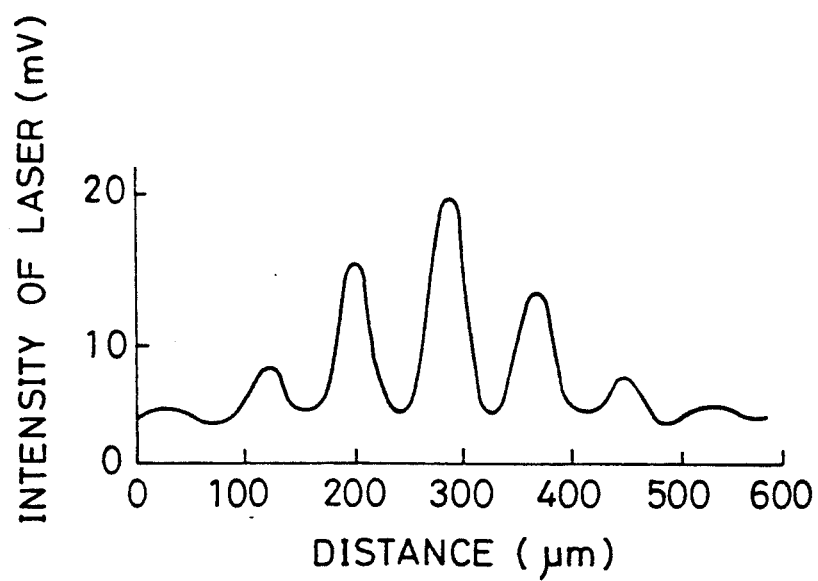

FIG. 10A shows a profile of a film formed on the laser-irradiation portion, and there are observed, in FIG. 10A, 7 lines having a width of 90 $\mu$m. This shape well corresponds with the distribution of the light intensity shown in FIG. 10B. Therefore, if a desired pattern is formed using a variety of optical instruments, thin films having desired patterns can be formed. In practice, a holography technique was employed to form fine patterns, and thus a film having a stripe pattern whose pitch was 4 $\mu$m could be obtained.

As has been explained above, according to the present example, a pattern having complicated unevenness can be formed at desired positions on a substrate without using photolithography techniques: the pattern can be formed by growing a film of GaAs while irradiating the substrate with an argon laser beam guided from the exterior of the vacuum chamber of an organometal molecular beam epitaxcial system, in which a semiconductor film is formed on a substrate using an organometal molecular beam of TEG and a hydride molecular beam obtained by the thermal decomposition of arsine in the vacuum chamber. The method of the present invention, when applied to the fabrication of various OEIC devices, can not only substantially reduce the number of processes involved, but also prevent the occurrence of defects at the boundary. Therefore, the method is effective for improving the quality of such devices and the reliability thereof.

In Embodiments 2 and 3, fabrication examples of GaAs films have been described. However, the selective growth was also confirmed with other binary compound semiconductors such as InP and GaP.

Examples of the organometals of Group III element Ga used in the present invention are triethylgallium, trimethylgallium, triisobutylgallium and diethylcyclopentadienylgallium. As an example of organoindium material, there can be used trimethylindium, but the selective growth of triethylindium was not confirmed. As the starting materials of Group V elements, metal arsenic and thermally-decomposed arsine were used as the starting materials for arsenic, and thermally-decomposed phosphine was used as the starting material for phosphorus.

Examples of the apparatuses of the present invention will hereunder be described. In the following Embodiments, like parts are designated by like reference numerals in FIG. 1.

EMBODIMENT 4

Figure 11:
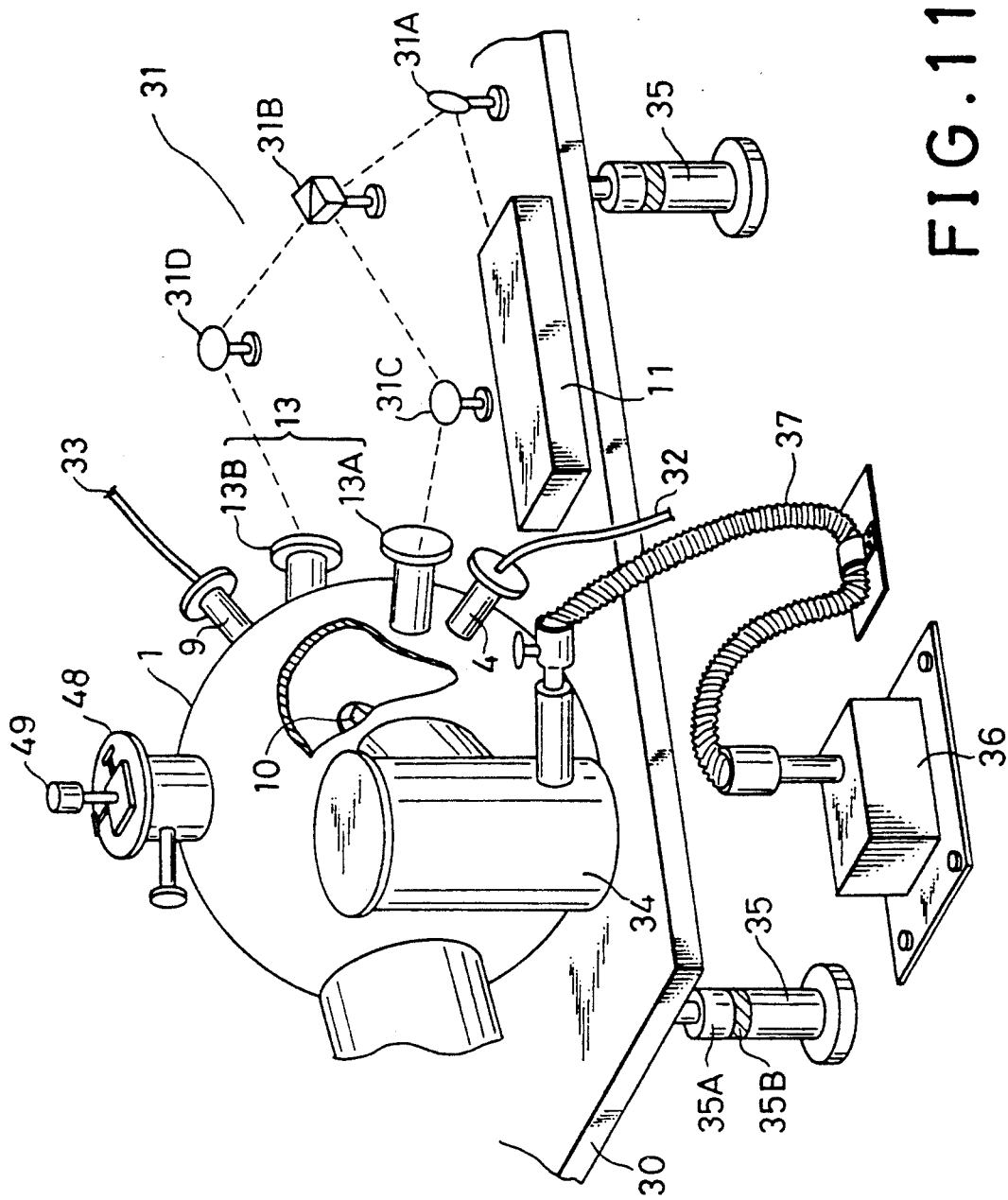
FIG. 11 is a perspective view schematically showing the construction of the fourth embodiment of the apparatus according to the present invention.

FIG. 11 shows the schematic construction of an apparatus according to the present invention. In FIG. 11, the reference numeral 30 designates a vibration proof base upon which are placed a spherical vacuum chamber 1 (the body of an MOMBE system), a laser ray source 11, and an optical system 31 composed of mirrors, half-mirrors or the like. The reference numerals 32 and 33 designate pipes for supplying the molecular beam cells 4 and 9 with starting materials discharged from the starting material cylinders 2, 5 and 7 through MFC's 3, 6 and 8. The reference numeral 34 designates a vacuum pumping system. The vacuum chamber 1 of the MOMBE system, the laser ray source 11 and the optical system 31 are mounted on the vibration proof base 30 so as to maintain the relative positions without being affected by external vibrations or the like. A light lead-in window 13 is provided so that the surface of the substrate 10 can be irradiated with laser rays emitted from the laser source 11 during growing a thin film of a semiconductor. The vacuum pumping system 34, provided with a diffusion pump, can keep the vibration at a very low level. The apparatus can be designed so that the vibrations externally generated are not transmitted to the vibration proof base 30 by connecting the vibration proof base 30 with parts attached thereto such as pipes 32 and 33 for supplying the starting materials, via flexible materials.

In the construction, the vibration proof base 30 is fixed to the floor through shock absorbers 35 each of which is composed of a hydraulic damper 35A and a vibration resistant rubber 35B. The reference numeral 36 designates a rotary pump fixed to the floor and is connected to a diffusion pump 34 through a flexible pipe 37, so that the vibration generated by the rotary pump 36 is not propagated to the vibration proof base 30.

Figure 14:
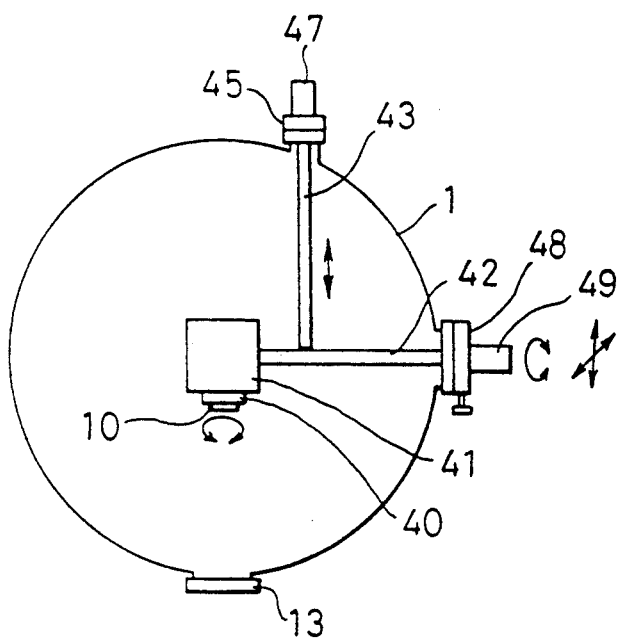
FIG. 14 is a schematic diagram showing the construction of the fifth embodiment of the apparatus according to the present invention.

The reference numerals 48 and 49 designate a movable mechanism and a knob shown in FIG. 14, respectively. The reference numerals 13A and 13B denotes windows shown in FIG. 21; the reference numerals 31A, 31C and 31D designate mirrors which constitute the optical system 31, and the reference numeral 31B denotes a half mirror. Each of these parts will be detailed in connection with FIGS. 14 and 21.

In this embodiment, the surface of the substrate 10 placed within the vacuum chamber 1 can be irradiated with a fine pattern of the laser beam, because the optical systems 31, such as mirrors, lenses and masks can be arranged in combination, on the vibration proof base 30. In addition, movable mirrors and lenses on the vibration proof base 30 make it possible for the fine laser beam converged by means of the lens 12 to scan the substrate 10. Moreover, making use of the coherency of the laser rays and utilizing a variety of mirrors and diffraction gratings as the optical elements make it possible for diffraction patterns or interference patterns to be projected on the surface of the substrate 10. As a result, it becomes possible to grow a thin film of a semiconductor having a pattern on the order of microns, which has never been obtained by the conventional techniques.

Figure 12:
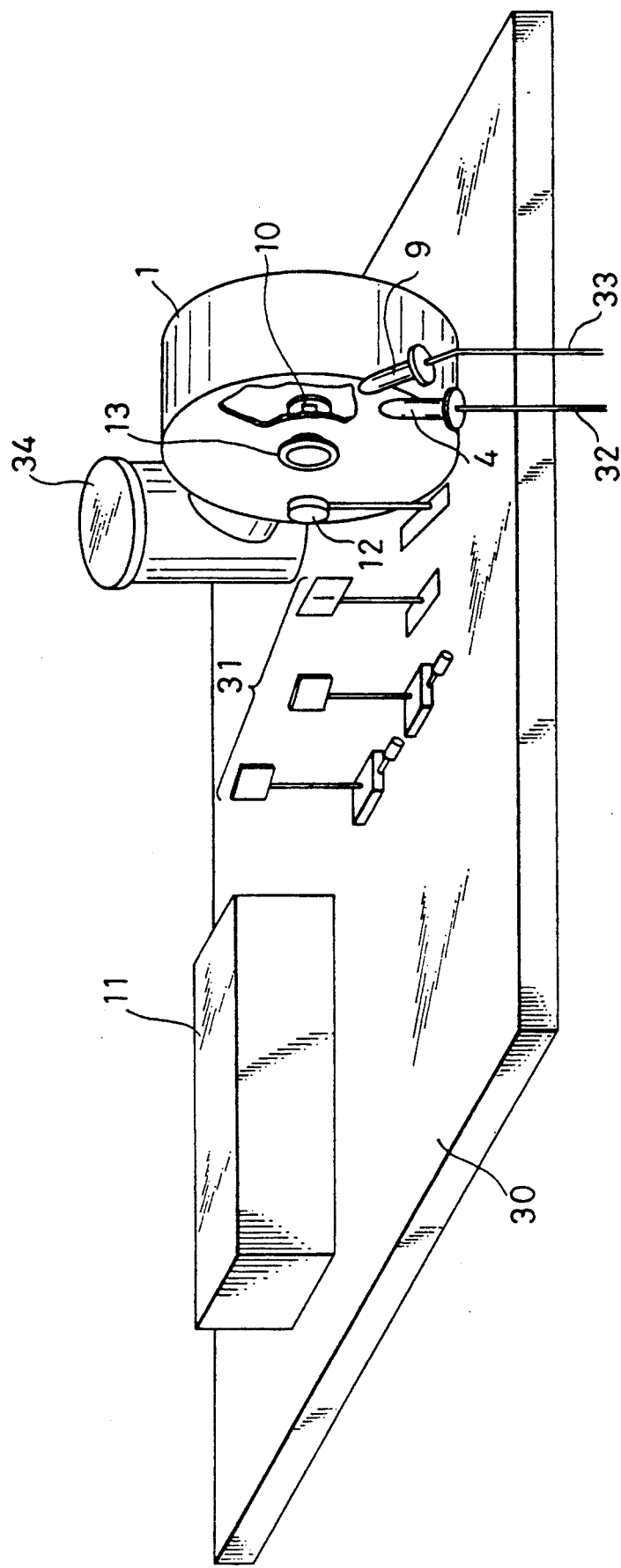
FIG. 12 is a perspective view schematically showing the construction of a variation of the fourth embodiment shown in FIG. 11.

FIG. 12 shows the construction of the apparatus shown in FIG. 11 more specifically, for example, formation of a very fine spot.

When the substrate 10 was irradiated with a laser beam finely focused by means of the lens 12, the diameter of the laser beam at its narrowest part (focal point) is proportional to the focal length of the lens 12. For this reason, it is preferred to use, as for the lens 12, a lens having a focal length as short as possible, and it is also desirable that the light lead-in window 13 is located near the substrate 10 as close as possible. To this end, the MOMBE system uses a cylindrical chamber as the vacuum chamber 1 to reduce the distance between the window 13 and the substrate 10 to less than 10 cm.

Figure 13:
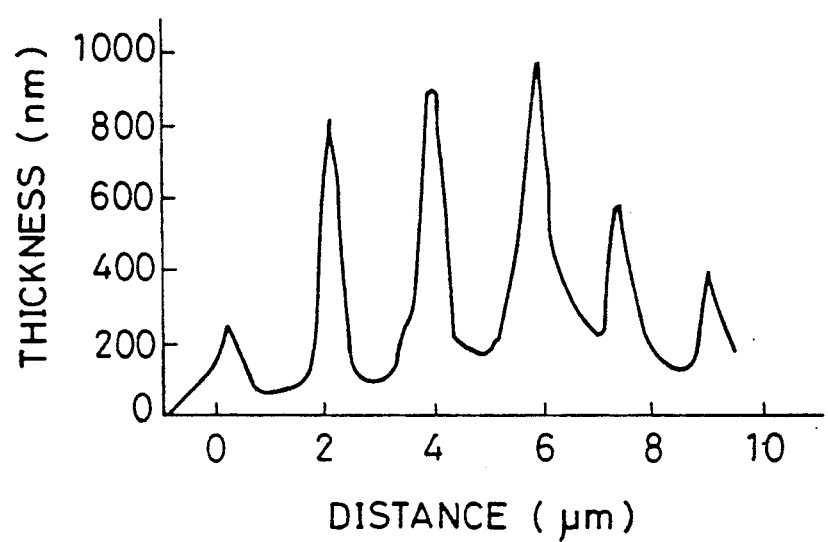
FIG. 13 is a cross-sectional view showing a semiconductor thin film formed utilizing the semiconductor thin film-forming apparatus shown in FIG. 11.

FIG. 13 shows a profile of a thin film of GaAs grown using the semiconductor thin film forming apparatus shown in FIG. 11. An argon laser (wavelength=514.5 nm) is used as the light source 11, and the laser output is divided into two parts by the half mirror constituting the optical system 31 so as to form an interference pattern on the substrate 10 with the split laser beams, to thus grow a thin film of a semiconductor having the corresponding pattern. As seen from the graph shown in FIG. 13, the resultant thin film has unevenness having a pitch of about 2 μm and a height of 800 nm.

As has been explained above, in this embodiment 4, little vibration is transmitted to the body 1 of the MOMBE system, the laser beam source 11 and the optical system 31 because they are integrally placed on the vibration proof base 30. This makes it possible to form a thin film of a semiconductor having a fine pattern. Consequently, the present invention is useful not only for fabricating semiconductor parts for optoelectronics such as DFB, DBR lasers or the like in which the corrugation is indispensable, but also for forming a patterned GaAs or InP thin film on a silicon substrate.

EMBODIMENT 5

FIG. 14 shows the schematic construction of the fifth embodiment of the apparatus according to the present invention. In FIG. 14, the reference numeral 40 designates a substrate holder; 41 adherents a rotating-and-heating portion which supports the substrate holder 40 and rotates the same; 42 denotes a main supporting rod for supporting the heating portion 41; and 43 a secondary supporting rod mounted to the vacuum chamber 1 so as to support the main supporting rod 42. Moreover, the reference numeral 45 designates a flange for supporting the secondary supporting rod 43, and 47 designates a moving knob for moving the secondary supporting rod 43 in the direction of the arrow. The reference numeral 48 designates a movable mechanism mounted to the vacuum chamber 1, to which the main supporting rod 42 is attached, thus making the main supporting rod 42 movable horizontally and vertically as indicated by the arrows. The reference numeral 49 designates a knob for rotating the main supporting rod 42 via the movable mechanism 48. When the knob 49 is rotated in the direction indicated by the arrow, the substrate 10 can also be rotated in the direction indicated by the arrow.

The substrate holder 40 inserted into the vacuum chamber 1 (the main chamber) through a chamber for exchanging the substrates (a sub-chamber; not shown) is mounted on the rotating-and-heating portion 41. Then, the horizontal and vertical positions of the substrate 40 is determined by operating the movable mechanism 48, and the substrate holder 41 is placed on a predetermined position by rotating the knob 49 to thus rotate the main supporting rod 42. Subsequently, the secondary supporting rod 43 is moved in the direction of the arrow to further support the main supporting rod 42.

Examples of methods for holding the main supporting rod 42 by the secondary supporting rod 43 are as follows: a first method comprising forming the end part of the secondary supporting rod 43 into a convex or concave shape, and if necessary, forming a portion of the rotating-and-heating portion 41 or the main supporting rod 42 to be engaged with the end part into the inverse shape, and pressing the end part against the portion with or without using a spring; a second method comprising mounting a wire or the like at the tip of the secondary supporting rod 43 and tightening or loosening the wire; and a third method comprising providing the main supporting rod 42 or the rotating-and-heating portion 41 with a rotatable part, and fixing the rotatable part to the chamber 1 by means of the secondary supporting rod 43. However, the method for supporting is not restricted to these specific examples described above.

Figure 15:
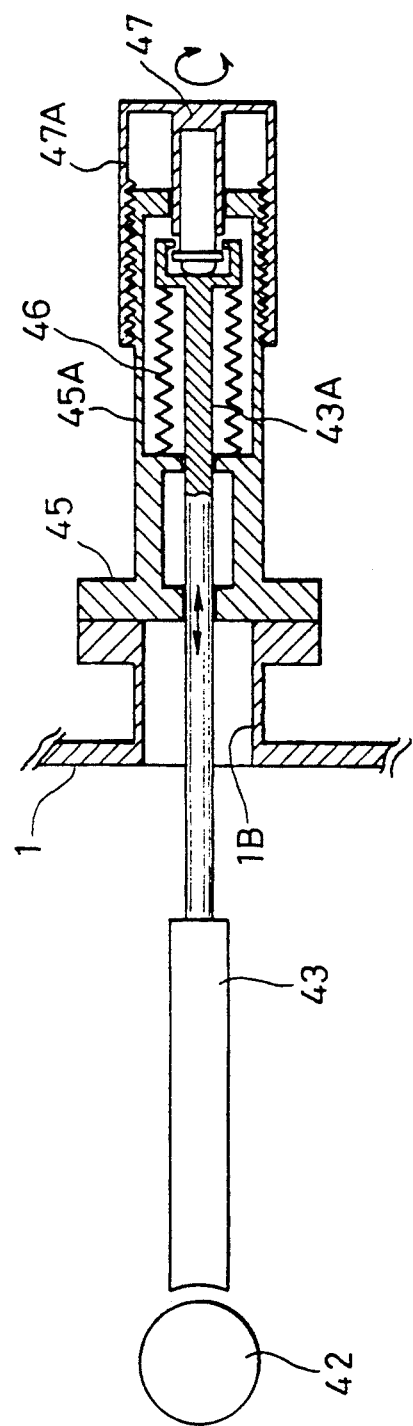
FIG. 15 is a sectional view showing an example of a specific construction of the supporting portion of a secondary supporting rod.

FIG. 15 shows a specific embodiment of the supporting part of the secondary supporting rod 43 shown in FIG. 14. The secondary supporting rod 43 herein has a flat or round sectional shape, and the end part thereof is formed into a concave shape having a curvature corresponding to the shape of the part of the main supporting rod 42. A supporting member 45, which supports the secondary supporting rod 43 in a movable manner through an opening 1B formed on the body 1 of the MOMBE system, is joined to the body. The tip 45A of the supporting member 45 has a hollow cylinder within which bellows 46 are disposed, and the tip portion 43A of the secondary supporting rod 43 passes through the bellows 46. The tip portion 43A of the rod 43 is connected to a linear lead-in terminal 47. An outer cylinder 47A of the linear lead-in terminal 47 is externally engaged with the hollow cylinder 45A of the supporting member 45 to thus screw the outer cylinder 47A onto the hollow cylinder 45A. Thus, when the linear lead-in terminal 47 is rotated in the direction of the indicated arrow, the secondary supporting rod 43 linearly moves in the direction of the arrow, and is pressed against the main supporting rod 42.

Thus, the vibration of the rotating-and-heating portion 41, and hence the substrate 10 can be suppressed to a minimum level by holding the rotating-and-heating portion 41 from at least two directions in such a manner as described above.

The vibrations of the substrate was practically measured in the MOMBE system having the structure shown in FIG. 14. The main supporting rod 42 is held by pressing the supporting rod 43, the end part of which is formed into a concave shape, against the main supporting rod 42 by means of a spring. The substrate 10 was placed in the chamber 1, and the amplitude of the vibration of the substrate 10 was measured under the conditions similar to those encountered during a film formation; the vibration thereof was measured in a non-contact manner while irradiating the substrate with a laser beam and evacuating the chamber. As a result, it was found that the amplitude of the vibration of the substrate was less than 0.1 μm.

EMBODIMENT 6

Figure 16:
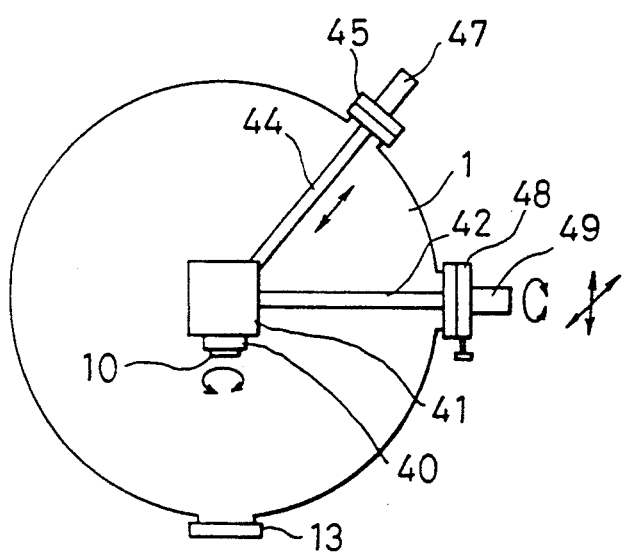
FIG. 16 is a schematic diagram showing the construction of the sixth embodiment of the apparatus according to the present invention.

In this Embodiment, a film growth apparatus shown in FIG. 16 was used. In this Embodiment, like parts are denoted by like reference numerals in FIG. 14. A secondary supporting rod 44 is herein fitted to a vacuum chamber 1 so as to support a heating portion 41. The substrate-rotating-and-heating portion 41 is held by pressing the convex shaped portion formed on the end part of the secondary supporting rod 44 against a concave portion formed on the joined portion of the rotating-and-heating portion 41. The substrate 10 was placed in the chamber 1, and the amplitude of the vibration of the substrate 10 was measured under the conditions similar to those encountered during the formation of a film; the vibration thereof was measured in a non-contact manner while irradiating the substrate with a laser beam and evacuating the chamber. As a result, it was found that the amplitude of the vibration of the substrate was less than 0.1 μm.

COMPARATIVE EXAMPLE

In this Comparative Example, the growth apparatus shown in FIG. 14 was employed, and the substraterotating-and-heating portion 41 was supported only by the main supporting rod 42 without using the secondary supporting rod 43. Other than this, procedures similar to those in Embodiment 5 were used to measure the amplitude of the vibration of the substrate 10. The amplitude thus found was about 2.0 μm.

Although examples have been described with reference to FIGS. 14 and 16, in which the heating portion 41 is supported in two directions, it is possible to suppress the vibration of the substrate by further increasing the number of the supporting directions, for instance, to three directions.

As explained above, in Embodiments 5 and 6, the MOMBE system for selectively growing a thin film of a semiconductor while irradiating the substrate 10 with light is provided with the substrate-rotating-and-heating portion 41 or the supporting rod 42 for supporting the substrate-rotating-and-heating portion 41, which is placed within the body 1 of the growth apparatus mounted on the vibration proof base 30, and is supported in at least two directions. This makes it possible to suppress the vibration of the substrate 10 and to maintain the distance between the optical system 31 and the substrate 10 constant, whereby thin films of semiconductors having fine structures can be formed with high accuracy. Consequently, the present invention is useful not only for fabricating semiconductor parts for optoelectronics such as DFB, DBR lasers or the like, but also for forming a patterned GaAs or InP thin film on a silicon substrate.

EMBODIMENT 7

Figure 17:
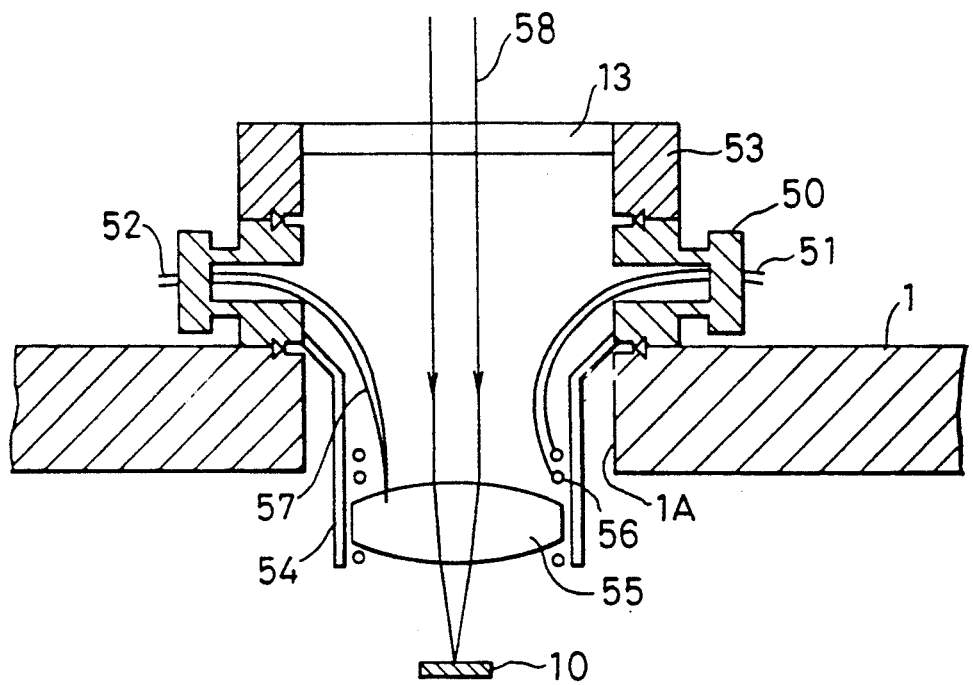
FIG. 17 is a sectional view showing the construction of the seventh embodiment of the apparatus according to the present invention.

FIG. 17 shows the schematic construction of the seventh embodiment of the apparatus according to the present invention. In FIG. 17, the reference numeral 50 designates a first ring-like flange fastened around an opening 1A used as a window of the body 1 of the MOMBE system. Ports through which conducting wires 51 and 52 for electrically connecting to the outside of the vacuum chamber 1 are formed through the flange 50.

The reference numeral 53 designates a second ring-like flange tightly attached to the first flange 50, and a window 13 made of a quartz plate is closely fixed to an opening of the second flange. A lens supporting member 54 is fitted inside the first flange 50, and is extended into the vacuum chamber 1 through the opening 1A. The lens 55 is fitted into and supported by the portion of the lens supporting member 54 which is located in the vacuum chamber 1. In this case, the lens 55 is positioned so that the focal point of the lens agrees with the surface of the substrate 10. A heater 56 is disposed at the periphery of the lens 55 so as to heat the lens 55. A thermocouple 57 is attached to the lens 55 so that the temperature of the lens 55 is measured, and hence the temperature of the heater 56 is controlled on the basis of the output signal from the thermocouple, thus adjusting the temperature of the lens 55 to 300° C. to 350° C.

When the apparatus of this Embodiment 7 is operated, the lens 55 is heated with the heater 56 to a temperature ranging from 300° to 350° C. measuring the temperature of the lens 55 by means of the thermocouple 57. The substrate 10 is irradiated with the laser rays 58 transmitted from the source 11 of the laser rays (see FIG. 1) through the window 13 and the lens 55 heated. The laser beam 58 is finest on the substrate 10 and thus becomes a fine spot by means of the optical system 12 (see FIG. 1) and the lens 55. A thin film of a semiconductor can be formed on a minute area of the substrate 10 which is irradiated with the laser beam by flowing molecular beams of starting gases from the molecular beam cells 4 and 9 (see FIG. 1) towards the substrate 10 while irradiating the substrate with the laser beam. The starting gases are, for instance, in the cases of III–V compound semiconductor, a gas of the Group V element or its compound, such as arsenic arsine or phosphine, and a gas of an organometal of a Group III element, such as triethylgallium or trimethylindium. In this apparatus, if the starting gases are supplied to the substrate without heating the lens 55 by the heater 56, arsenic or the like is deposited on the lens 55 within a short period, and hence, the lens 55 becomes opaque. Accordingly, the effect of irradiating the substrate with the laser rays 58 cannot be achieved, and the selective formation of a thin film becomes impossible.

In the present embodiment, the film growth apparatus is provided with the lens heating means as has been explained above. Therefore, the substrate 10 in the MOMBE system 1 can be irradiated with the laser rays 58 in the form of a very thin beam, and a fine pattern can be depicted on the surface of the substrate 10 by scanning the surface with the laser beam by moving or shifting the mirrors of the optical system 12 and/or the lens 55 using a fine moving device.

Figure 18:
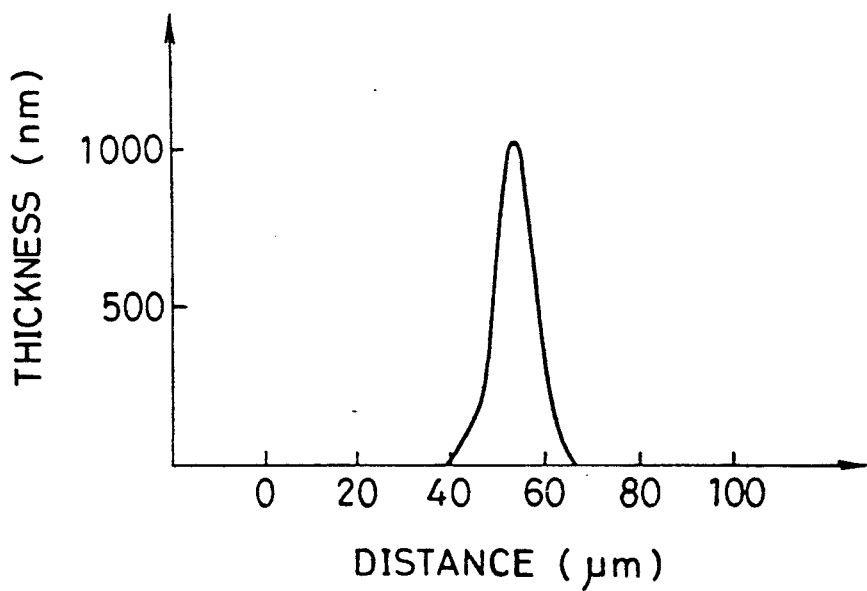
FIG. 18 is a sectional view showing an example of the section of a semiconductor thin film formed utilizing the semiconductor thin film-forming apparatus shown in FIG. 17.

FIG. 18 shows a profile of an example of the thin film of GaAs obtained using the semiconductor thin film forming apparatus according to the present invention. A quartz lens 55 placed at a position 30 mm apart from the substrate 10 was heated to 350° C., and the thin film was grown while irradiating the substrate 10 with an argon laser beam having a diameter of about 1.5 mm (wavelength=514.5 nm). The lens 55 did not become opaque during the film growth operation. The resultant thin film had a diameter of about 20 μm and a height of 1,000 nm as shown in FIG. 18.

As has been explained above, the semiconductor thin film forming apparatus can in general form fine patterns by placing a lens within the body of the MOMBE system together with a substrate which is irradiated with a laser beam from a source thereof through a window. However, conventional apparatuses have a disadvantage that the lens soon becomes opaque. The inventors of this invention have found that the lens never becomes opaque if it is heated. For this reason, a lens provided with a heating mechanism is placed inside the window, that is, within the body of the MOMBE system in the present example. This makes it possible to form a semiconductor thin film having a fine structure on a substrate 10. Therefore, a variety of patterns such as optical waveguides can be depicted on the substrate 10 by scanning the surface of the substrate with such a very small beam spot. Thus, the present invention is useful not only for fabricating semiconductor parts for optoelectronics such as OEIC, but also for forming a patterned GaAs or InP thin film on a silicon substrate.

EMBODIMENT 8

Figure 19:
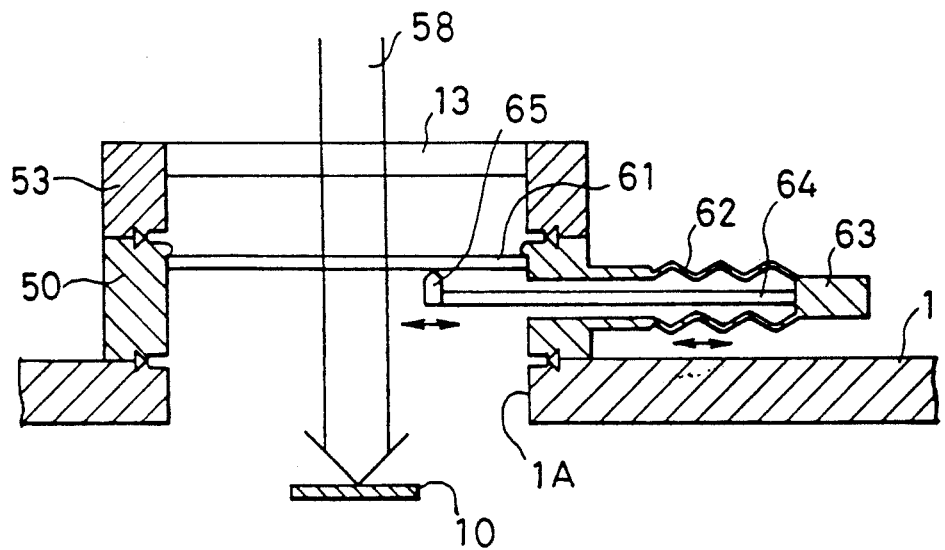
FIG. 19 is a sectional view showing eighth embodiment of the apparatus according to the present invention.

FIG. 19 shows the construction of the eighth embodiment of the apparatus according to the present invention. In FIG. 19, the reference numeral 61 designates a glass plate fitted in the first flange 50 inside the window 13 on the body 1 of the MOMBE system; 62 designates bellows attached to the first flange 50; and 63 denotes a knob attached to the end of the bellows 62. The knob 63 is provided with a rod 64 passing through the bellows 62 and projecting to the inside of the first flange 50. The rod 64 is provided with, at its tip, a remover 65 of a plastic serving as a deposit removing member which is pressed against the glass plate 61 so as to remove the deposit adherent to the surface of the glass plate 61. The bellows 62 is flexible and so makes it possible to externally operate the knob 63 in the direction of the arrow while maintaining the high vacuum condition in body 1 of the MOMBE system. Thus, the deposits can be removed from the glass plate 61 by moving the remover 65 in the direction of the arrow.

Figure 20:
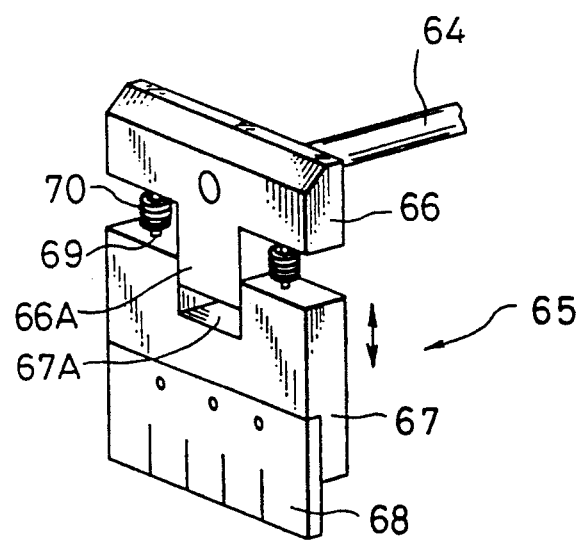
FIG. 20 is a perspective view showing a specific embodiment of a remover.

FIG. 20 shows a specific embodiment of the remover 65 shown in FIG. 19. In FIG. 20, the reference numeral 66 designates a T-shaped member fastened to the rod 64, and 67 designates a supporting member having a notch 67A which slidably receives the branched portion 66A of the T-shaped member 66. To the supporting member 67, a tongue-like member 68 of a plastic is attached. The tongue-like member 68 has a plurality of slits to thus smoothly wipe the glass plate 61. The supporting member 67 is movable in the direction of the arrow along the notch 67A with respect to the member 66 by means of a shaft 69 and a spring 70.

During the growth of a thin film, a Group V element or its compound such as arsenic, arsine or phosphine, or a Group III element of its compound such as trimethylgallium or triethylgallium is present in the body 1 of the MOMBE system. These elements are deposited on the surface of the glass plate facing the substrate 10 in the case shown in FIG. 19. Thus, the glass plate 61 gradually becomes opague, which hinders the introduction of laser rays 8 into the body 1 of the MOMBE system. In such a case, the deposits adherent to the glass plate 61 can be removed by pressing the remover 65 against the surface of the glass plate 61 which faces the substrate 10, and wiping or rubbing the plate with the remover 65.

In this embodiment 8, the remover 65 made of 1 is used, but other plastic materials such as Teflon (trade mark), or materials other than plastics can be used as long as they do not generated gases under a vacuum and do not scratch the glass plate 61.

As has been explained above, the apparatus of this embodiment is designed so that the deposits adherent onto the glass plate 61 are removed by the deposit removing member 65: the glass plate 61 is fixed inside the window 13 for introducing laser rays into the body 1 of the MOMBE system so as to irradiate the substrate 10 in the body 1; and the deposit removing member 65 is provided inside the window 13 on the body 1 of the MOMBE system so as to be moved in contact with the glass plate 61 fixed inside the window 13. In addition, the apparatus is also designed so that the deposit removing member 65 can be operated from the outside. Therefore, semiconductor materials deposited on the surface of the glass plate 61 fixed inside the window 13 on the body 1 of the MOMBE system can be cleaned. Thus, the glass plate 61 can be made transparent every time thin film growth is completed, or during any thin film growth operation, and hence, the conditions for irradiating the substrate 10 with light can be maintained constant, whereby the increasing number of semiconductor thin films can be prepared under the same condition.

Therefore, a variety of patterns such as optical waveguides and lasers can be depicted on the substrate 10 by scanning the surface of the substrate with such a minute beam spot. Moreover, the present invention is useful not only for fabricating semiconductor parts for optoelectronics such as OEIC, but also for forming a patterned GaAs or InP thin film on a silicon substrate.

Furthermore, when the construction of a view port 84 (see FIG. 21) for monitoring the portion of a film during a film growth is replaced with that of this embodiment in an MBE apparatus or MOMBE system, it becomes possible to remove the deposits adherent to a quartz plate of the view port, making it possible to continue such observation for a long period.

EMBODIMENT 9

Figure 21:
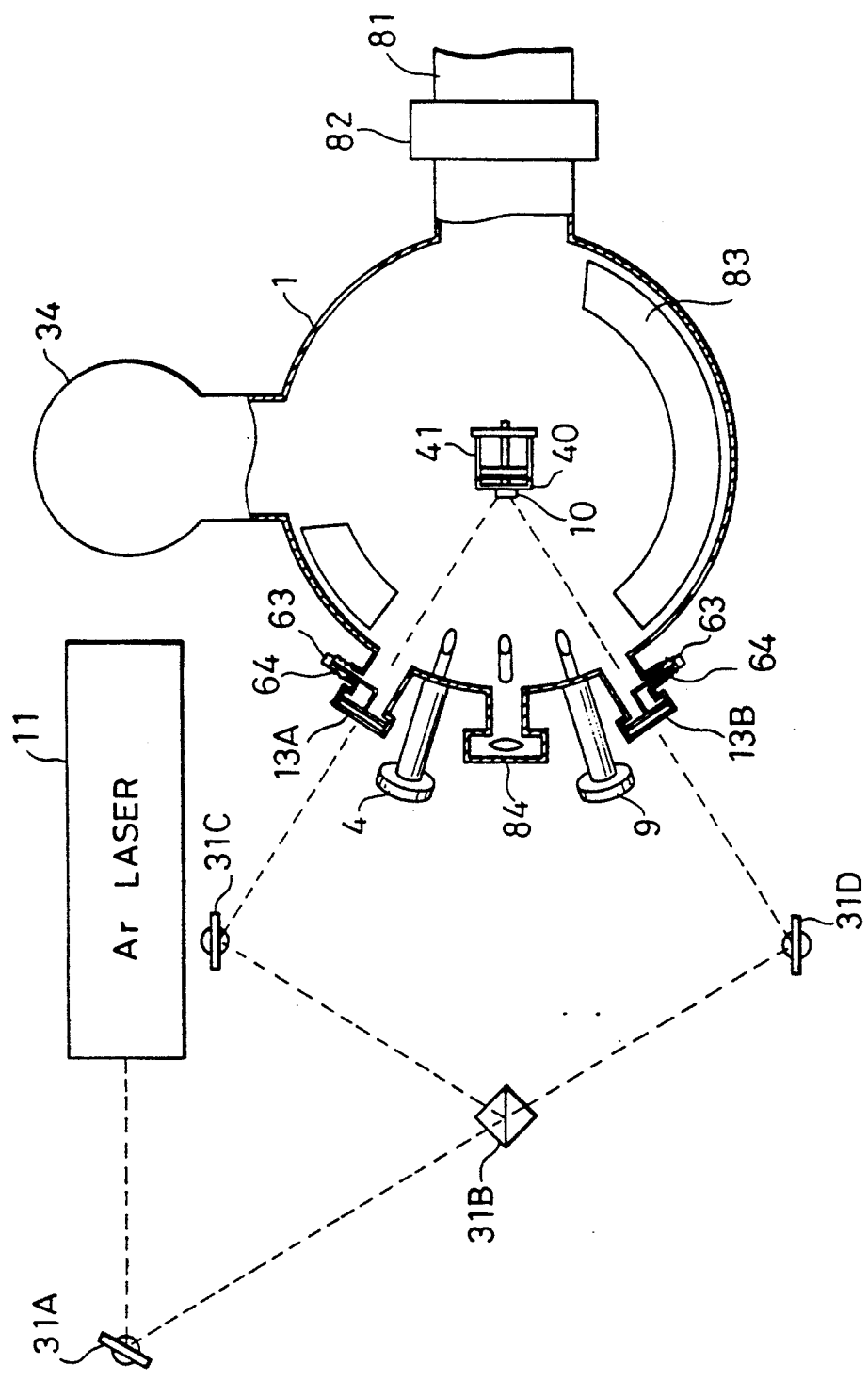
FIGS. 21 and 22 are a horizontal sectional view and a longitudinal sectional view of the ninth embodiment of the apparatus according to the present invention, respectively.
Figure 22:
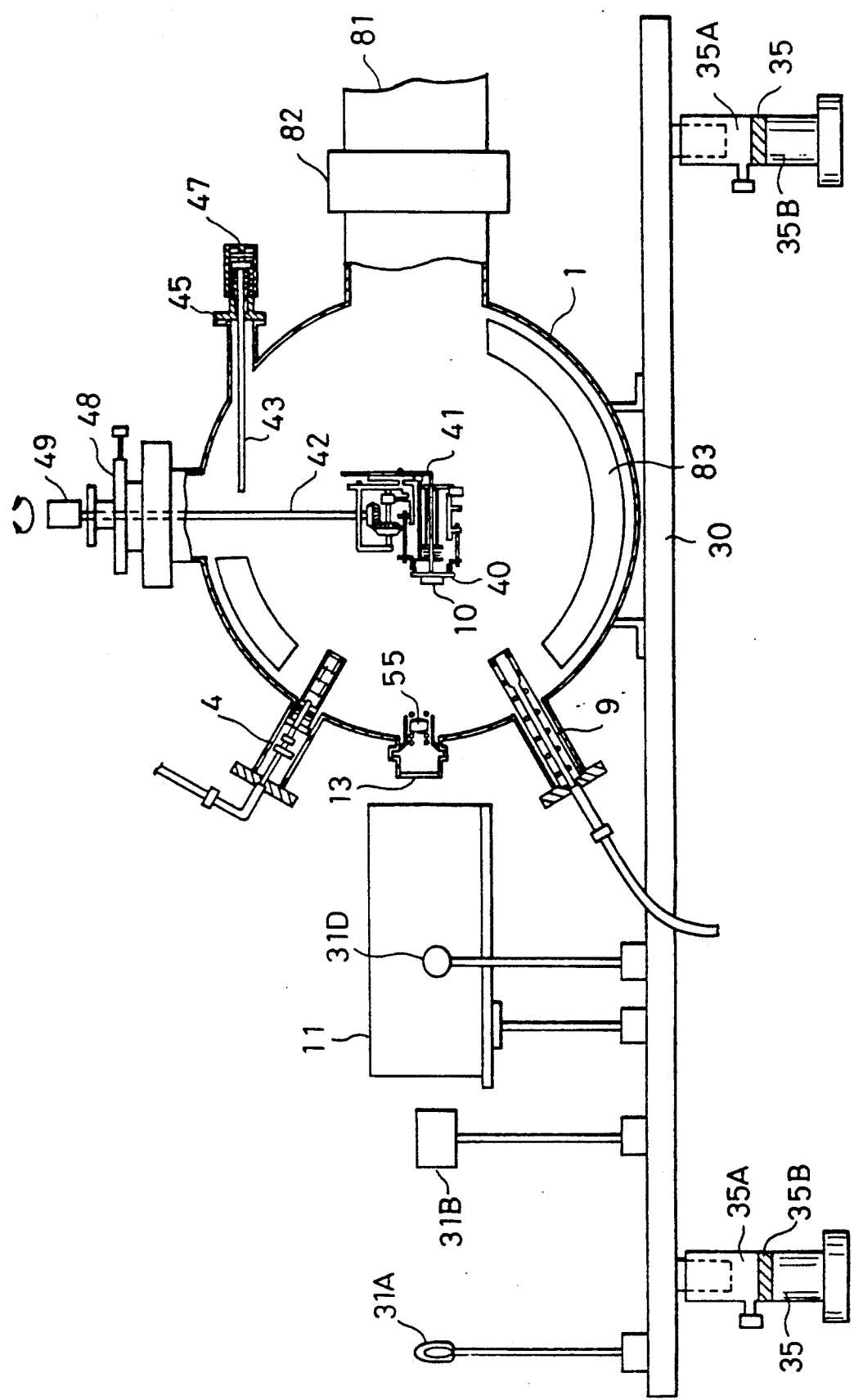
Figure 14:
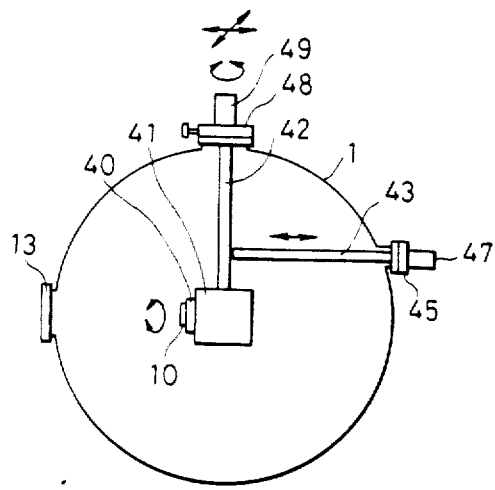
Figure 16:
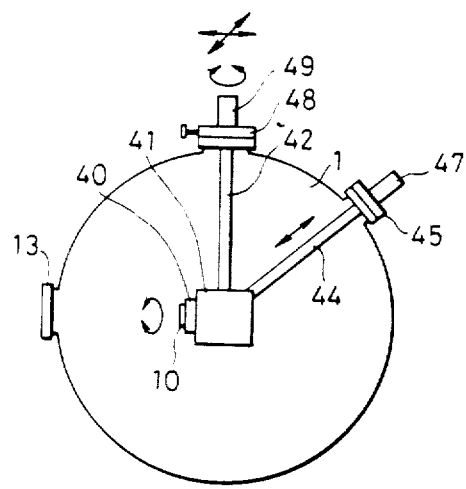

FIGS. 21 and 22 show the overall structure of a thin film forming apparatus equipped with the apparatuses explained in Examples 4, 5, 7 and 8. In these figures, like parts in FIGS. 11, 12, 14, 15, 17, 19 and 20 are designated by like numerals. The reference numeral 81 designates a sub-chamber serving as a chamber for exchanging substrates. It is separated from a vacuum chamber 1, the main chamber, by a gate valve 82; 83 designates a liquid-nitrogen reservoir placed within the vacuum chamber 1, and 84 denotes a view port for monitoring the film growing on the substrate 10.

In this embodiment, the optical system 31 shown in FIG. 11 is composed of mirrors 31A, 31C and 31D and a half mirror 31B. In this embodiment, a pair of windows 13A and 13B are placed so as to face the substrate 10. This arrangement makes it possible to cause interference between two laser beams passing through these windows to thus form a diffraction grating suitable for DFB lasers or the like.

INDUSTRIAL AVAILABILITY

According to the method of the present invention, it is possible to freely enhance or suppress the film growth rate by appropriately setting the temperature of the substrate, and by irradiating the portion on the substrate corresponding to a desired pattern during the MOMBE growth with laser rays having an energy lower than that of the photon which can directly decompose an organometal. Therefore, the method of this invention makes it possible to form on a substrate a thin film of a compound semiconductor having a fine pattern with complicated unevenness. The method of the present invention further makes it possible to simultaneously form a film and a fine pattern without using any lithography techniques and therefore, the number of processes can substantially been reduced. Furthermore, the method of the present invention does not require the repetition of the film growth processes several times in order to obtain such a thin film of a semiconductor having a desired fine pattern. Therefore, the method of this invention does not suffer from such a conventionally encountered disadvantage that crystal defects are formed at the boundary between the consecutive two layers formed during two successive film growth processes, and thus serves to improve the quality of the devices and its reliability.

It has already been described above that conventional films grown at a low temperature are not practically acceptable, but according to the present invention, thin films of semiconductors having good acceptable quality can be prepared. Moreover, the method of the present invention makes it possible to control the composition of a multiple component semiconductor film, and to reduce the concentration of carbon present in the film by irradiating the substrate with laser rays.

Generally speaking, MOMBE systems use a rotary pump together with a diffusion pump to evacuate the body on the system to a pressure of the order of not more than $10^{-3}$ Torr, and vibrations generated by the rotary pump make the formation of a fine pattern difficult.

However, in the apparatus of the present invention, the body of an MOMBE system, a source of laser rays, and an optical system for guiding laser rays to the body of the MOMBE system are mounted and arranged on a vibration proof base. As a result, the relative positions of the source of laser rays, the optical system for irradiating the substrate with the laser rays, and the substrate positioned within the vacuum chamber are always maintained constant. Thus, a fine pattern can be obtained according to the apparatus of the present invention.

The apparatus of the present invention prevents the vibrations generated during the film forming process from propagating to the substrate: the vibration proof base is installed; and in addition, the substrate supporting part such as a substrate-rotating-and-heating portion for holding the substrate is supported in at least two directions; or a member for supporting the substrate holding portion is further supported by another supporting member. This makes it possible to form a thin film of a semiconductor having a fine pattern.

Furthermore, the lens is heated in the apparatus of the present invention. This makes it possible to position the lens inside the window for transmitting laser rays onto the substrate and in turn to position the lens in close vicinity to the substrate. Therefore, a lens having a short focal length can be used, whereby the diameter of the laser beam can be converged to an extremely thin beam and thus a fine pattern can be obtained.

Moreover, the apparatus of the present invention may be provided with a mechanism for removing deposits of semiconductor materials adhering to the window for transmitting laser rays unto a substrate or those deposited on a glass plate fixed inside the window. Therefore, such deposits can be removed at any time required such as before and after the film growth operation and/or during the film growth operation without stopping the process. This makes it possible to effectively perform the aforementioned method of the present invention and to thus improve the quality of the resulting semiconductor thin films. In addition, this mechanism can eliminate troublesome operations such as removing the window from the MOMBE system for cleaning the same.

What is claimed is:

1. An apparatus for forming a thin film of a semiconductor comprising:
   a vacuum chamber constituting a body of a metalorganic molecular beam epitaxial system;
   a vacuum system for establishing a vacuum within said vacuum chamber by evacuation;
   a holder for holding a substrate within said vacuum chamber;
   a first cell for forming a molecular beam of an organometal of an element constituting a compound semiconductor, and for guiding said formed molecular beam to said substrate;
   a second cell for forming a molecular beam of said the other element of the compound semiconductor, and for guiding said formed molecular beam to said substrate;
   a first supply system for supplying said first cell with a starting material of said organometal;
   a second supplying system for supplying said second cell with a starting material of said the other element;
   a source of laser rays for generating laser rays with which said substrate is irradiated;
   an optical system for guiding said laser rays from its source to said substrate;
   a light lead-in window for guiding said laser rays from said optical system to said substrate placed within said vacuum chamber; and
   a vibration proof base on which said source of laser rays, said optical system and said vacuum chamber are mounted so that the propagation of external vibrations is prevented.

2. An apparatus for forming a semiconductor thin film as claimed in claim 1, wherein parts of said vacuum system that generate vibrations are placed on a floor separated from said vibration proof base, and said vacuum chamber is communicated with said vibration-generating parts through flexible members to thus prevent the vibration from propagating from said floor to said vibration proof base.

3. An apparatus for forming a semiconductor thin film as claimed in claim 1, further comprising a first supporting rod for supporting said holder in said vacuum chamber in such a manner that the position of said holding member can be adjusted, and a second supporting rod being pressed against said holding member or said first supporting rod so as to regulate the shift of said holding member or said first supporting rod.

4. An apparatus for forming a semiconductor thin film as claimed in claim 1, further comprising a second optical system and a means for heating said second optical system, said second optical system being placed inside said light incident window within said vacuum chamber, and guiding said laser rays incident upon said substrate through said window.

5. An apparatus for forming a semiconductor thin film as claimed in claim 1, further comprising a member for removing deposits adherent on said light lead-in window within said vacuum chamber, and said removing member being in contact with said window.

* * * * *

UNITED STATES PATENT AND TRADEMARK OFFICE
CERTIFICATE OF CORRECTION

PATENT NO. : 5,186,750
DATED : February 16, 1993
INVENTOR(S) : SUGIURA, et al.

It is certified that error appears in the above-indentified patent and that said Letters Patent is hereby corrected as shown below:

In the Drawings

Please delete Fig. 14 and Fig. 16 and substitute therefor the attached correct Fig. 14 and Fig. 16.

Signed and Sealed this

Nineteenth Day of July, 1994

*Attest:*

BRUCE LEHMAN

*Attesting Officer*     Commissioner of Patents and Trademarks